(12) United States Patent
Yen et al.

(10) Patent No.: US 12,009,317 B2
(45) Date of Patent: Jun. 11, 2024

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US); Kay Stefan Essig, Radebeul (DE)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 122 days.

(21) Appl. No.: 17/321,139

(22) Filed: May 14, 2021

(65) Prior Publication Data

US 2022/0367384 A1    Nov. 17, 2022

(51) Int. Cl.
*H01L 23/495* (2006.01)
*H01L 21/56* (2006.01)
*H01L 23/00* (2006.01)
*H01L 23/31* (2006.01)
*H01L 23/433* (2006.01)

(52) U.S. Cl.
CPC .......... *H01L 23/562* (2013.01); *H01L 21/56* (2013.01); *H01L 23/3107* (2013.01); *H01L 23/433* (2013.01); *H01L 23/49548* (2013.01)

(58) Field of Classification Search
CPC ... H01L 23/562; H01L 21/56; H01L 23/3107; H01L 23/433; H01L 23/49548

USPC .......................................................... 257/669
See application file for complete search history.

(56) References Cited

U.S. PATENT DOCUMENTS

| | | | |
|---|---|---|---|
| 2007/0108564 A1* | 5/2007 | Tang | H01L 23/4334 257/E23.044 |
| 2020/0203302 A1* | 6/2020 | Chew | H01L 23/295 |
| 2020/0312790 A1* | 10/2020 | Yew | H01L 23/36 |
| 2021/0159188 A1* | 5/2021 | Fang | H01L 23/5389 |

FOREIGN PATENT DOCUMENTS

CN        102867805 A     1/2013

* cited by examiner

*Primary Examiner* — Caleb E Henry
*Assistant Examiner* — Dilinh P Nguyen
(74) *Attorney, Agent, or Firm* — FOLEY & LARDNER LLP

(57) ABSTRACT

A semiconductor package structure and a method for manufacturing a semiconductor package structure are provided. The semiconductor package structure includes a substrate, a semiconductor device, an encapsulant, a balance structure, and a warpage-resistant layer. The semiconductor device is disposed on the substrate. The encapsulant encapsulates the semiconductor device. The balance structure is on the semiconductor device and contacting the encapsulant. The warpage-resistant layer is between the semiconductor device and the balance structure. The encapsulant contacts a lateral surface of the warpage-resistant layer.

9 Claims, 26 Drawing Sheets

4A

4B

4A

4B

SEMICONDUCTOR PACKAGE STRUCTURE AND METHOD FOR MANUFACTURING THE SAME

BACKGROUND

1. Technical Field

The present disclosure relates generally to a semiconductor package structure and a method for manufacturing a semiconductor package structure.

2. Description of the Related Art

Along with the rapid development in electronics industry and the progress of semiconductor processing technologies, semiconductor chips are integrated with an increasing number of electronic components to achieve improved electrical performance and additional functions. However, the increasing number of electronic components may raise further reliability issues. For example, warpage may easily occur during the manufacturing process as well as to the final product.

SUMMARY

In one or more embodiments, a semiconductor package structure includes a substrate, a semiconductor device, an encapsulant, a balance structure, and a warpage-resistant layer. The semiconductor device is disposed on the substrate. The encapsulant encapsulates the semiconductor device. The balance structure is on the semiconductor device and contacting the encapsulant. The warpage-resistant layer is between the semiconductor device and the balance structure. The encapsulant contacts a lateral surface of the warpage-resistant layer.

In one or more embodiments, a semiconductor package structure includes a substrate, a semiconductor device, an encapsulant, and a heat dissipation structure. The semiconductor device is disposed on the substrate. The encapsulant encapsulates the substrate and the semiconductor device. The heat dissipation structure is disposed on the semiconductor device and the encapsulant. A first distance between the heat dissipation structure and the semiconductor device is greater than a second distance between the heat dissipation structure and the encapsulant.

In one or more embodiments, a method of manufacturing a semiconductor package structure includes the following operations: forming a warpage-resistant layer on a semiconductor device; disposing the semiconductor device on a substrate; disposing a balance structure on the semiconductor; and encapsulating the semiconductor device after disposing the balance structure.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 3A-1 illustrates a cross-sectional view of a portion of a semiconductor package structure 3A in accordance with some embodiments of the present disclosure;

Figure 1A:
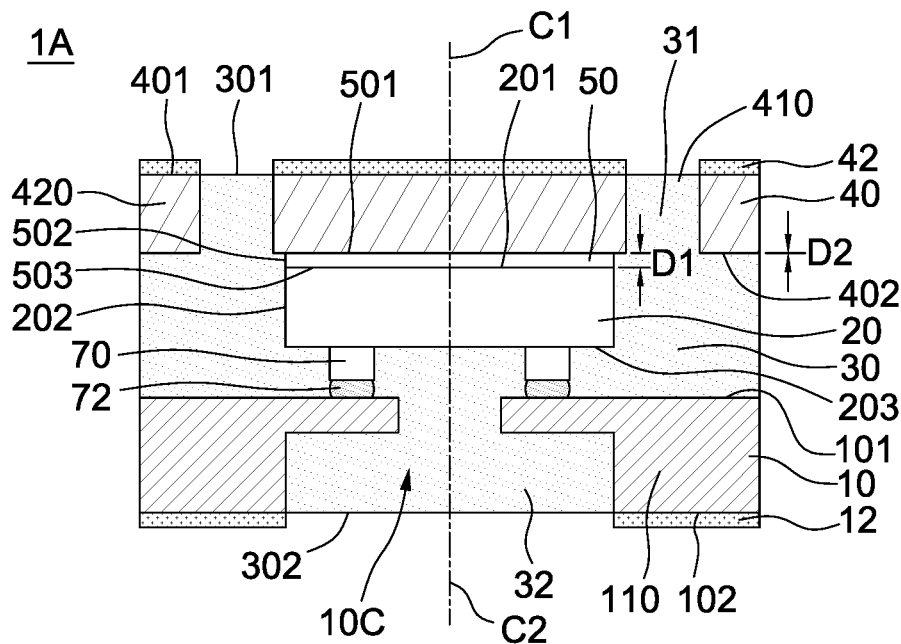
FIG. 1A illustrates a cross-sectional view of a semiconductor package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

FIG. 1A illustrates a cross-sectional view of a semiconductor package structure 1A in accordance with some embodiments of the present disclosure. The semiconductor package structure 1A includes a substrate 10, a semiconductor device 20, an encapsulant 30, a balance structure 40, a warpage-resistant layer 50, and protection layers 12 and 42.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as one or more conductive traces and one or more through vias. In some embodiments, the substrate 10 includes a ceramic material or a metal plate. In some embodiments, the substrate 10 may include an organic substrate or a leadframe. In some embodiments, the substrate 10 is a leadframe including a plurality of leads 110. The number of leads 110 may vary according to actual applications. In some embodiments, the semiconductor package structure 1A may be a quad flat no-lead (QFN) package structure.

The semiconductor device 20 may be disposed on the substrate 10. In some embodiments, the semiconductor device 20 is flip-chip bonded to the substrate 10 (or the leadframe). In some embodiments, the semiconductor device 20 is connected to the substrate 10 through conductive elements 70. In some embodiments, the conductive elements 70 may include conductive pillars, conductive studs, conductive pads, or the like. In some embodiments, the conductive elements 70 are connected to the substrate 10 through conductive bumps 72. The semiconductor device 20 may have a surface 201, a surface 203 opposite to the surface 201, and a surface 202 (also referred to as "a lateral surface") extending between the surface 201 and the surface 203. In some embodiments, the surface 201 may be a back surface, and the surface 203 may be an active surface of the semiconductor device 20 facing toward the substrate 10 (or the leadframe). The semiconductor device 20 may be an active component, such as an integrated circuit (IC) chip or a die. The semiconductor device 20 may be a passive electrical component, such as a capacitor, a resistor or an inductor.

The encapsulant 30 may encapsulate the semiconductor device 20. In some embodiments, the encapsulant 30 encapsulates the substrate 10 and the semiconductor device 20. In some embodiments, a surface 302 (also referred to as "a bottom surface") of the encapsulant 30 is coplanar with a surface 102 (also referred to as "a bottom surface") of the leads 110. In some embodiments, the bottom surface (i.e., the surface 302) of the encapsulant 30 is lower than a surface 101 (also referred to as "a top surface") of the leads 110. In some embodiments, the bottom surface (i.e., the surface 302) of the encapsulant 30 is coplanar with a bottommost surface (i.e., the surface 102) of the substrate 10. In some embodiments, the encapsulant 30 includes an epoxy resin having fillers, a molding compound (e.g., an epoxy molding compound or other molding compound), polyimide, a phenolic compound or material, a material with a silicone dispersed therein, or a combination thereof.

In some embodiments, the encapsulant 30 may include a plurality of portions (e.g., portions 31 and 32). In some embodiments, the portion 32 of the encapsulant 30 is engaged with the substrate 10. In some embodiments, the substrate 10 may define a space 10C (or a cavity), and the portion 32 of the encapsulant 30 is filled in the space 10C of the substrate 10. In some embodiments, a bottom surface (i.e., the surface 302) of the portion 32 of the encapsulant 30 is coplanar with the bottommost surface (i.e., the surface 102) of the substrate 10. In some embodiments, a bottom surface (i.e., the surface 302) of the portion 32 of the encapsulant 30 is coplanar with a bottom surface (i.e., the surface 102) of the leads 110.

The balance structure 40 may be on the semiconductor device 20. The balance structure 40 can be configured to balance the warpage of the semiconductor package structure 1A. The balance structure 40 disposed on the back surface of the semiconductor device 20 can balance the stress and/or warpage caused by the substrate 10 disposed on the active surface of the semiconductor device 20. By way of an example, the balance structure 40 can be partially disposed on the back surface of the semiconductor device 20 and physically symmetrical to the substrate 10 to compensate for the stress caused by the substrate 10 to alleviate the warpage. By way of another example, the balance structure 40 can be entirely disposed on the back surface of the semiconductor device 20 to provide suppress the stress caused by the substrate 10 to alleviate the warpage. In some embodiments, the balance structure 40 is disposed on the semiconductor device 20 and the encapsulant 30. In some embodiments, the balance structure 40 directly contacts or physically contacts the encapsulant 30. The balance structure 40 may have a surface 401 (also referred to as "an upper surface") and a surface 402 (also referred to as "a bottom surface") opposite to the surface 401. The surface 401 of the balance structure 40 may be facing away from the semiconductor device 20. In some embodiments, a surface roughness (Ra) of the surface 401 is greater than a surface roughness of the surface 402. In some embodiments, the surface 401 of the balance structure 40 has a uniform surface roughness. In some embodiments, the balance structure 40 is or includes a heat dissipation structure, such as a heat sink. In some embodiments, the balance structure 40 may include a metal material.

In some embodiments, a distance D1 between the balance structure 40 and the semiconductor device 20 is greater than a distance D2 between the balance structure 40 and the encapsulant 30. In some embodiments, the distance D2 may be substantially 0.

In some embodiments, the portion 31 of the encapsulant 30 is engaged with the balance structure 40. In some embodiments, the balance structure 40 includes at least one opening 410 (also referred to as "through hole"). In some embodiments, the portion 31 of the encapsulant 30 is filled in the opening 410. In some embodiments, the balance structure 40 includes a plurality of portions 420 (also referred to as "connection portions") defining the opening 410 (or the through hole), and the portion 31 of the encapsulant 30 is disposed into the opening 410 (or the through hole). In some embodiments, the portion 31 of the encapsulant 30 penetrates through the opening 410 (or the through hole). In some embodiments, the portion 31 of the encapsulant 30 is filled in the opening 410 (or the through hole). In some embodiments, a surface 301 (also referred to as "an upper surface") of the portion 31 of the encapsulant 30 is coplanar with the surface 401 (also referred to as "an upper surface") of the balance structure 40. In some embodiments, the upper surface (i.e., the surface 301) of the portion 31 of the encapsulant 30 is higher than the bottom surface (i.e., the surface 402) of the balance structure 40.

In some embodiments, a geometric central line C1 of the balance structure 40 substantially aligns to a geometric central line C2 of the substrate 10.

The warpage-resistant layer 50 may be between the semiconductor device 20 and the balance structure 40. The warpage-resistant layer 50 is configured to compensate the warpage which could have been caused by the difference in wiring densities and/or the CTEs on two opposite surfaces such as an active surface and a back surface) of the semiconductor device 20. In some embodiments, the warpage-resistant layer 50 may include a conductive layer such as a metal layer. In some embodiments, the warpage-resistant layer 50 is disposed on the surface 102 (or the back surface) of the semiconductor device 20. In some embodiments, the warpage-resistant layer 50 directly contacts or physically contacts the back surface (i.e., the surface 201) of the semiconductor device 20. The warpage-resistant layer 50 may have a surface 501, a surface 503 opposite to the surface 501, and a surface 502 (also referred to as "a lateral surface") extending between the surface 501 and the surface 503. In some embodiments, the lateral surface (i.e., the surface 502) of the warpage-resistant layer 50 directly contacts or physically contacts the encapsulant 30. In some embodiments, the lateral surface (i.e., the surface 502) of the warpage-resistant layer 50 substantially aligns to the lateral surface (i.e., the surface 202) of the semiconductor device 20. In some embodiments, the surface 503 of the warpage-resistant layer 50 directly contacts or physically contacts the back surface (i.e., the surface 201) of the semiconductor device 20. In some embodiments, a thickness of the warpage-resistant layer 50 is equal to or less than the distance D1 between the balance structure 40 and the semiconductor device 20. In some embodiments, the encapsulant 30 covers an interface between the semiconductor device 20 and the warpage-resistant layer 50. The material of the warpage-resistant layer 50 may include metal, alloy or other conductive materials. Examples of the materials of the warpage-resistant layer 50 may include, but is not limited to, titanium (Ti), copper (Cu), nickel (Ni), palladium (Pd), or a combination thereof. In some embodiments, the warpage-resistant layer 50 may include titanium/copper. According to some embodiments of the present disclosure, the warpage-resistant layer 50 covering the back surface of the semiconductor device 20 may compensate the warpage which could have been caused by the difference in wiring densities and/or the CTEs on the active surface and on the back surface of the semiconductor device 20. Therefore, the warpage of the semiconductor device 20 can be prevented, and thus the reliability of the semiconductor package structure 1A can be improved.

The protection layer 12 may be on the surface 102 (or the bottom surface) of the substrate 10. In some embodiments, the protective layer 12 may include a metal finish such as nickel/gold or nickel/palladium. In some other embodiments, the protective layer 12 may include an organic solderability preservative (OSP).

The protection layer 42 may be on a surface 401 (or the upper surface) of the balance structure 40. In some embodiments, the protective layer 42 may include a metal finish such as nickel/gold or nickel/palladium. In some other embodiments, the protective layer 42 may include an OSP.

While the semiconductor device 20 may have a relatively high wiring density on the active surface than on the back surface, such un-uniform distribution in wiring densities may result in warpage of the semiconductor device 20, which may affect the reliability of the flip-chip bonding process of the semiconductor device 20 to the substrate 10. In addition, since the coefficient of thermal expansion (CTE) of wirings is different from the CTE of the base layer or substrate layer (e.g., a silicon-based layer) of the semiconductor device 20, the difference in the CTEs, resulted from the un-uniform distribution in wiring densities, on the active surface and on the back surface of the semiconductor device 20 may cause warpage of the semiconductor device 20 as well. In contrast, according to some embodiments of the present disclosure, the warpage-resistant layer 50 covering the back surface of the semiconductor device 20 may compensate the warpage which could have been caused by the difference in wiring densities and/or the CTEs on the active surface and on the back surface of the semiconductor device 20. Therefore, the warpage of the semiconductor device 20 can be prevented, and thus the reliability of the semiconductor package structure 1A can be improved.

In addition, according to some embodiments of the present disclosure, the encapsulant 30 engaged with the balance structure 40 and the substrate 10 may form a "moldlock" structure which can effectively increase the adhesion between the substrate 10, the encapsulant 30, and the balance structure 40. Therefore, the structural strength of the semiconductor package structure 1A can be improved.

Moreover, according to some embodiments of the present disclosure, the balance structure 40 may include a metal material, and thus the warpage-resistant layer 50 between the semiconductor device 20 and the balance structure 40 can increase the adhesion between the semiconductor device 20 and the balance structure 40.

Furthermore, according to some embodiments of the present disclosure, the balance structure 40 and the substrate 10 are arranged in a symmetric fashion, for example, the geometric central lines of the balance structure 40 and the substrate 10 substantially align to each other. Thus, the warpage which could have been caused by an asymmetric arrangement of components/elements of the semiconductor package structure 1A or by the relatively large size of the semiconductor package structure 1A can be effectively reduced or prevented. For example, the stress from the un-uniform distribution of CTEs of materials/components/elements among the semiconductor package structure 1A can be compensated by the substrate 10 and the balance structure 40 which are symmetrically arranged with respect to each other. Therefore, the reliability of the semiconductor package structure 1A can be improved.

Figure 1B:
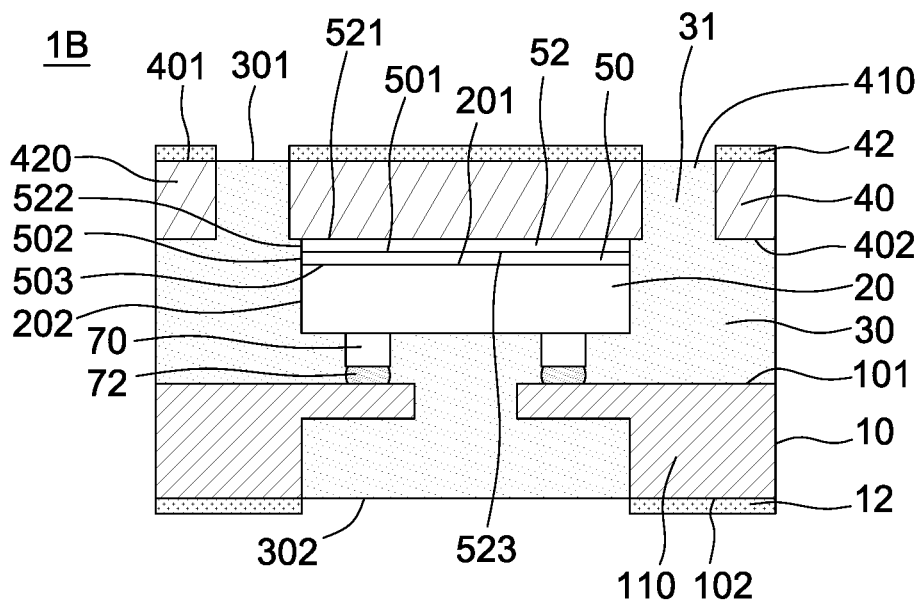
FIG. 1B illustrates a cross-sectional view of a semiconductor package structure in accordance with some embodiments of the present disclosure.

In addition, according to some embodiments of the present disclosure, the balance structure 40 includes a heat dissipation layer and directly contacts or physically contacts the encapsulant 30, and thus the heat dissipation effect of the semiconductor package structure 1A can be improved. In addition FIG. 1B illustrates a cross-sectional view of a semiconductor package structure 1B in accordance with some embodiments of the present disclosure. The semiconductor package structure 1B is similar to the semiconductor package structure 1A in FIG. 1A except that, for example, the semiconductor package structure 1B further includes a binder 52.

In some embodiments, the binder 52 adheres the warpage-resistant layer 50 to the balance structure 40. In some embodiments, a sum of a thickness of the binder 52 and the thickness of the warpage-resistant layer 50 may be substantially equal to the distance D1 between the balance structure 40 and the semiconductor device 20. In some embodiments, the binder 52 includes a paste, such as a metal paste.

In some embodiments, the binder 52 has a surface 521, a surface 523 opposite to the surface 521, and a surface 522 (also referred to as "a lateral surface") extending between the surface 521 and the surface 523. In some embodiments, the encapsulant 30 directly contacts or physically contacts the lateral surface (i.e., the surface 522) of the binder 52. In some embodiments, the lateral surface (i.e., the surface 522) of the binder 52 substantially aligns to the lateral surface (i.e., the surface 502) of the warpage-resistant layer 50. In some embodiments, the encapsulant 30 covers an interface between the warpage-resistant layer 50 and the binder 52.

According to some embodiments of the present disclosure, the balance structure 40 may include a metal material, and thus the binder 52 between the warpage-resistant layer 50 and the balance structure 40 can increase the adhesion between the semiconductor device 20 and the balance structure 40.

Figure 1C:
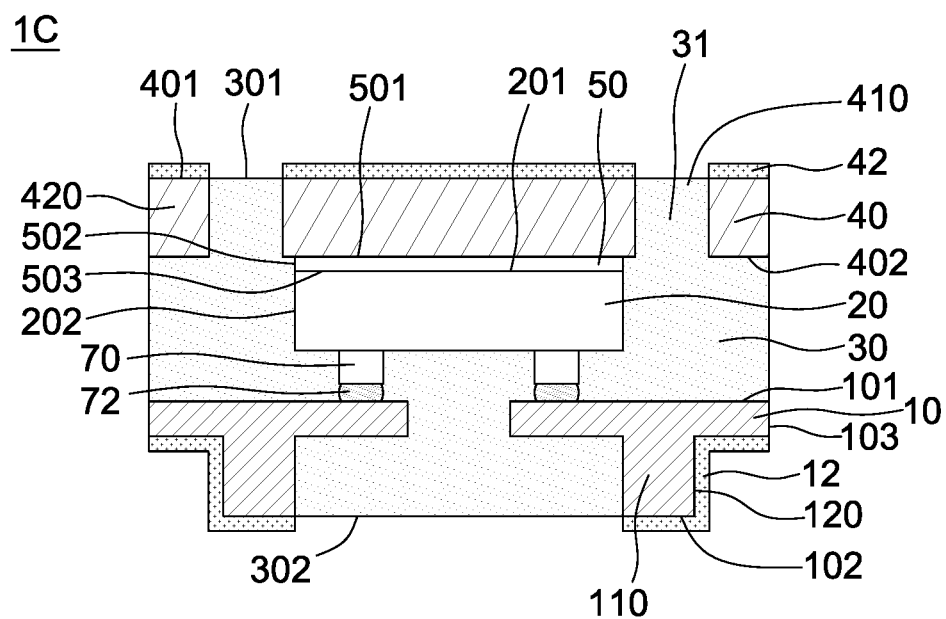
FIG. 1C illustrates a cross-sectional view of a semiconductor package structure in accordance with some embodiments of the present disclosure.

FIG. 1C illustrates a cross-sectional view of a semiconductor package structure 1C in accordance with some embodiments of the present disclosure. The semiconductor package structure 1C is similar to the semiconductor package structure 1A in FIG. 1A except that, for example, the substrate 10 of the semiconductor package structure 1C further includes a wettable flank 120. In some embodiments, the wettable flank 120 is recessed from the bottom surface (i.e., the surface 102) and the lateral surface (i.e., the surface 103) of the substrate 10. In some embodiments, the protection layer 12 covers the wettable flank 120 of the substrate 10.

Figure 1D:
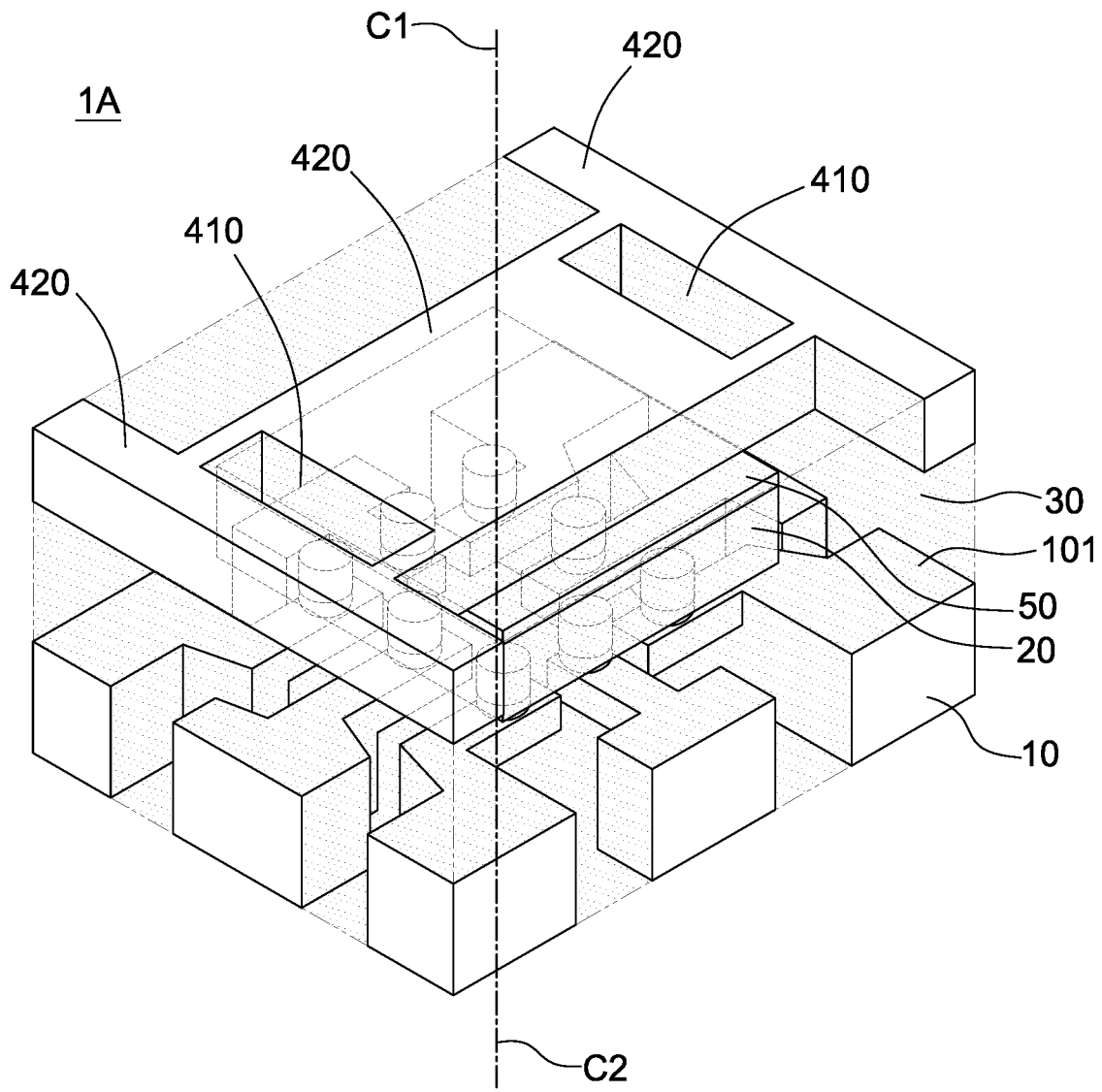
FIG. 1D illustrates a perspective view of a semiconductor package structure in accordance with some embodiments of the present disclosure.

FIG. 1D illustrates a perspective view of a semiconductor package structure in accordance with some embodiments of the present disclosure. In some embodiments, the structure in FIG. 1D may illustrate a perspective view of the semiconductor package structure 1A shown in FIG. 1A.

In some embodiments, a geometric central line C1 of the balance structure 40 substantially aligns to a geometric central line C2 of the substrate 10. In some embodiments, a peripheral outline of the balance structure 40 overlaps a peripheral outline of the substrate 10 from a top view perspective.

Figure 1E:
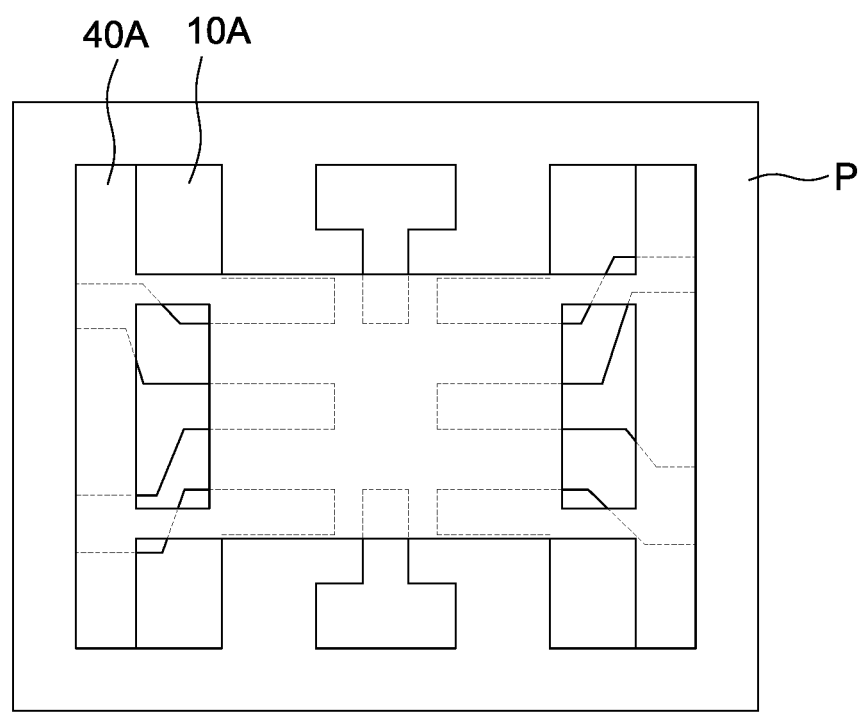
FIG. 1E illustrates a top view of a semiconductor package structure in accordance with some embodiments of the present disclosure.

FIG. 1E illustrates a top view of a semiconductor package structure in accordance with some embodiments of the present disclosure. In some embodiments, the structure in FIG. 1E may illustrate a top view of the semiconductor package structure 1A shown in FIG. 1A. Some elements are omitted in FIG. 1E for clarity.

In some embodiments, a projection 40A of the balance structure 40 on a plane P overlaps a protection 10A of the substrate 10 on the plane P. The plane P may refer to a virtual plane serving as a reference for representing the projections 10A and 40A. The plane P may also refer to an upper surface of an additional layer or film disposed under the substrate 10. In some embodiments, a ratio of an area of the projection 40A of the balance structure 40 on the plane P to an area of the projection 10A of the substrate 10 on the plane P is from about 0.8 to about 1.2. In some embodiments, the aforesaid ratio may be from about 0.9 to about 1.1.

According to some embodiments of the present disclosure, the balance structure 40 and the substrate 10 are arranged in a symmetric fashion, for example, the ratio of an area of the projection 40A of the balance structure 40 on the plane P to an area of the projection 10A of the substrate 10 on the plane P may be from about 0.8 to about 1.2. Thus, the warpage which could have been caused by an asymmetric arrangement of components/elements of the semiconductor package structure 1A or by the relatively large size of the semiconductor package structure 1A can be effectively reduced or prevented. For example, the stress from the tilted or asymmetric arrangements of materials/components/elements among the semiconductor package structure 1A can be compensated by the substrate 10 and the balance structure 40 which are symmetrically arranged with respect to each other. Therefore, the reliability of the semiconductor package structure 1A can be improved.

Figure 2A:
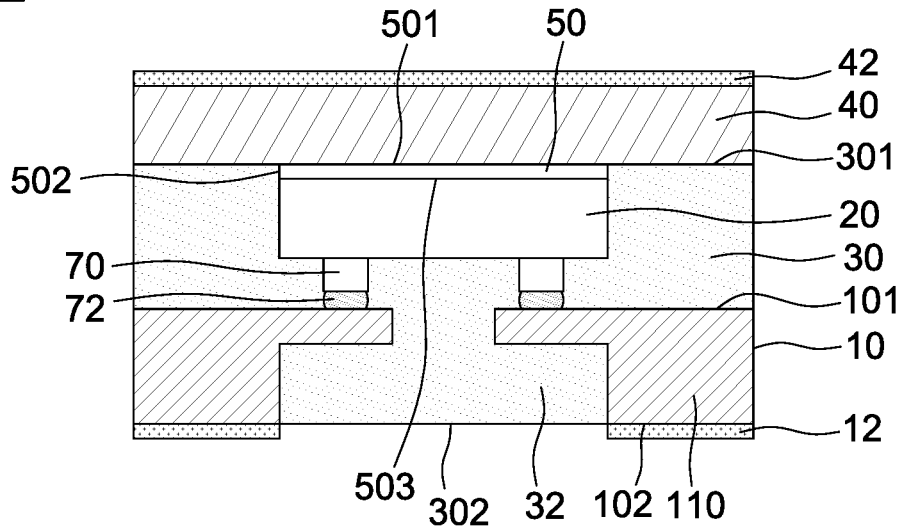
FIG. 2A illustrates a cross-sectional view of a semiconductor package structure in accordance with some embodiments of the present disclosure.

FIG. 2A illustrates a cross-sectional view of a semiconductor package structure 2A in accordance with some embodiments of the present disclosure. The semiconductor package structure 2A is similar to the semiconductor package structure 1A in FIG. 1A except that, for example, the balance structure 40 includes a different structure.

In some embodiments, the balance structure 40 is free of openings or through holes. In some embodiments, the balance structure 40 may be or include a planar plate. In some embodiments, the surface 501 of the warpage-resistant layer 50 is in contact with the balance structure 40 and coplanar with a surface 301' (also referred to as "an upper surface") of the encapsulant 30. In some embodiments, the semiconductor package structure 2A may further include a binder (not shown in FIG. 2A) adhering the warpage-resistant layer 50 to the balance structure 40.

In some embodiments, the surface 501 of the warpage-resistant layer 50 has a microstructure, for example, a plurality of micro grooves, a plurality of micro scratches, a plurality of micro trenches, or a combination thereof. In some embodiments, the microstructure of the surface 501 of the warpage-resistant layer 50 may be formed by a grinding operation. According to some embodiments of the present disclosure, the microstructure of the surface 501 of the warpage-resistant layer 50 is advantageous to increasing the adhesion between the warpage-resistant layer 50 and the balance structure 40.

Figure 2B:
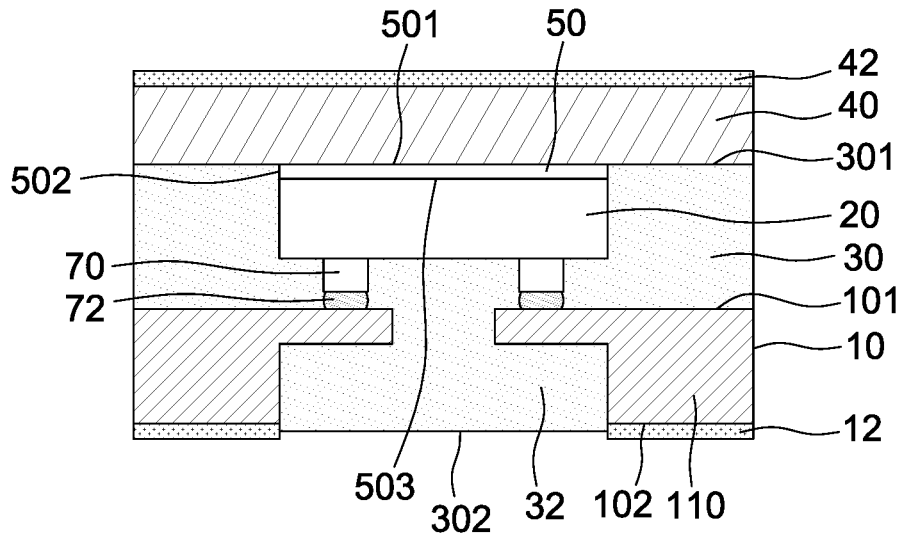
FIG. 2B illustrates a cross-sectional view of a semiconductor package structure in accordance with some embodiments of the present disclosure.

FIG. 2B illustrates a cross-sectional view of a semiconductor package structure 2B in accordance with some embodiments of the present disclosure. The semiconductor package structure 2B is similar to the semiconductor package structure 2A in FIG. 2A except that, for example, a bottom surface (i.e., the surface 302) of the portion 32 of the encapsulant 30 is protruded out of a bottommost surface (i.e., the surface 102) of the substrate 10.

In some embodiments, the bottom surface (i.e., the surface 302) of the portion 32 of the encapsulant 30 is at an elevation different from an elevation of the bottommost surface (i.e., the surface 102) of the substrate 10. In some embodiments, the bottom surface (i.e., the surface 102) of the leads 110 is recessed from the bottom surface (i.e., the surface 302) of the encapsulant 30.

Figure 2C:
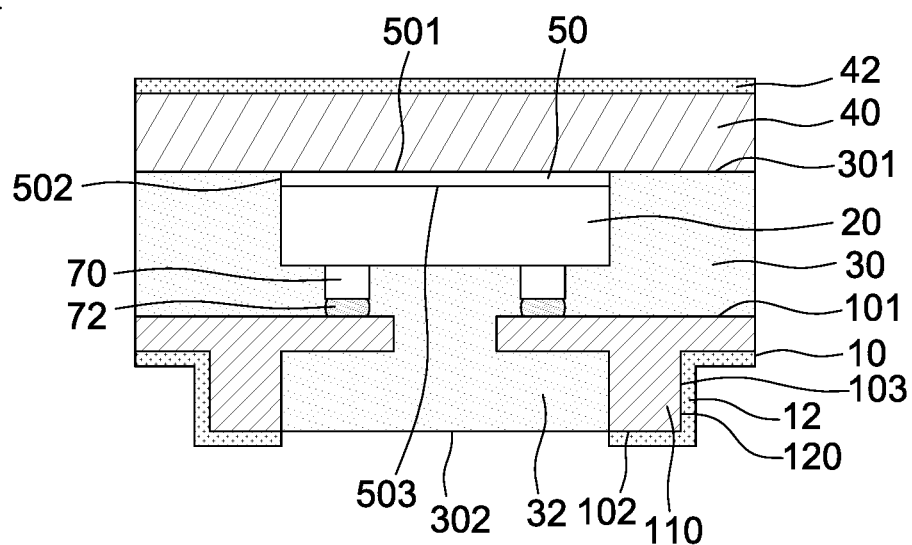
FIG. 2C illustrates a cross-sectional view of a semiconductor package structure in accordance with some embodiments of the present disclosure.

FIG. 2C illustrates a cross-sectional view of a semiconductor package structure 2C in accordance with some embodiments of the present disclosure. The semiconductor package structure 2C is similar to the semiconductor package structure 2A in FIG. 2A except that, for example, the substrate 10 of the semiconductor package structure 2C further includes a wettable flank 120. In some embodiments, the protection layer 12 covers the wettable flank 120 of the substrate 10.

Figure 2D:
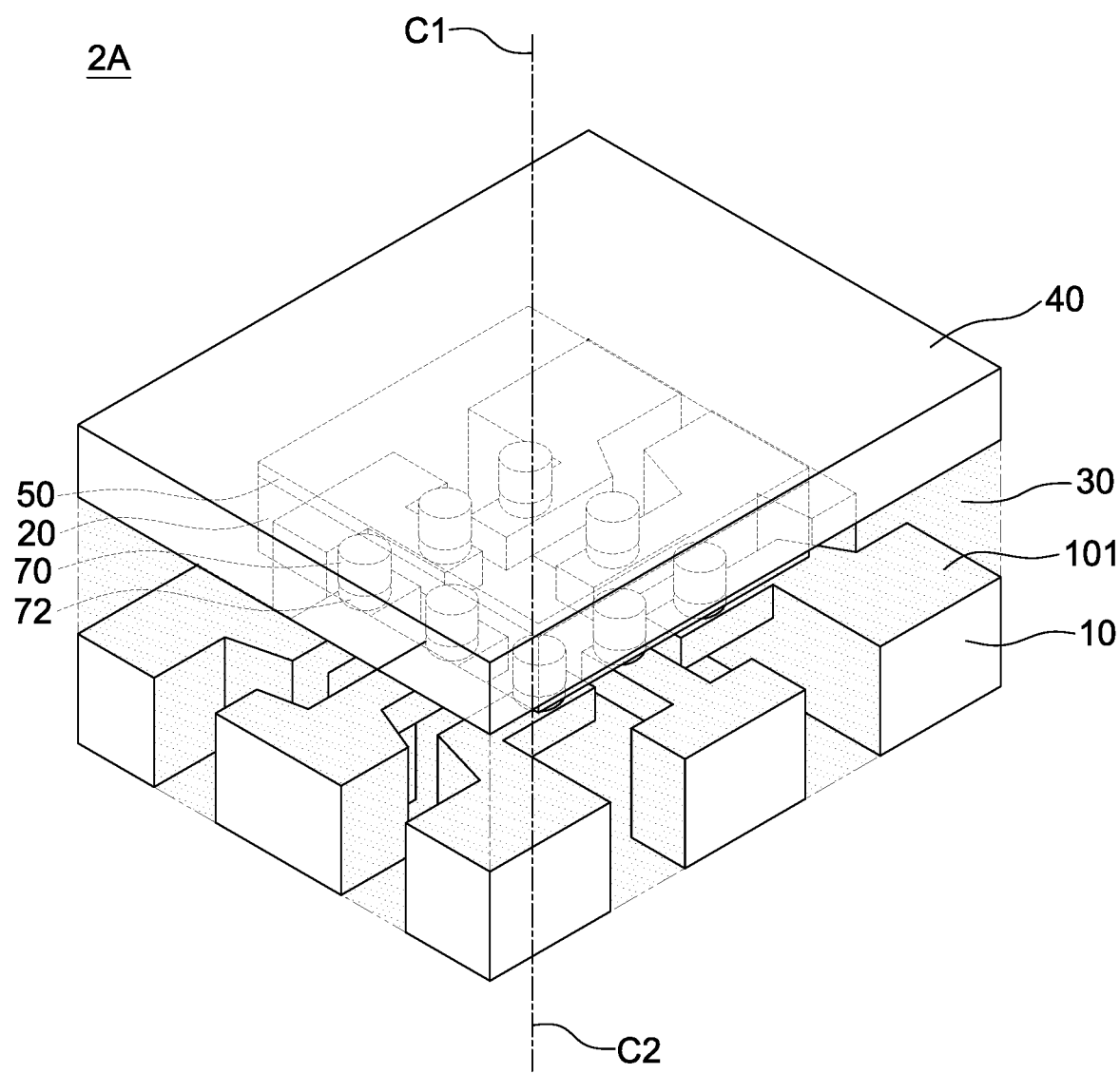
FIG. 2D illustrates a perspective view of a semiconductor package structure in accordance with some embodiments of the present disclosure.

FIG. 2D illustrates a perspective view of a semiconductor package structure in accordance with some embodiments of the present disclosure. In some embodiments, the structure in FIG. 2D may illustrate a perspective view of the semiconductor package structure 2A shown in FIG. 2A.

In some embodiments, a geometric central line C1 of the balance structure 40 substantially aligns to a geometric central line C2 of the substrate 10. In some embodiments, a peripheral outline of the balance structure 40 overlaps a peripheral outline of the substrate 10 from a top view perspective.

Figure 2E:
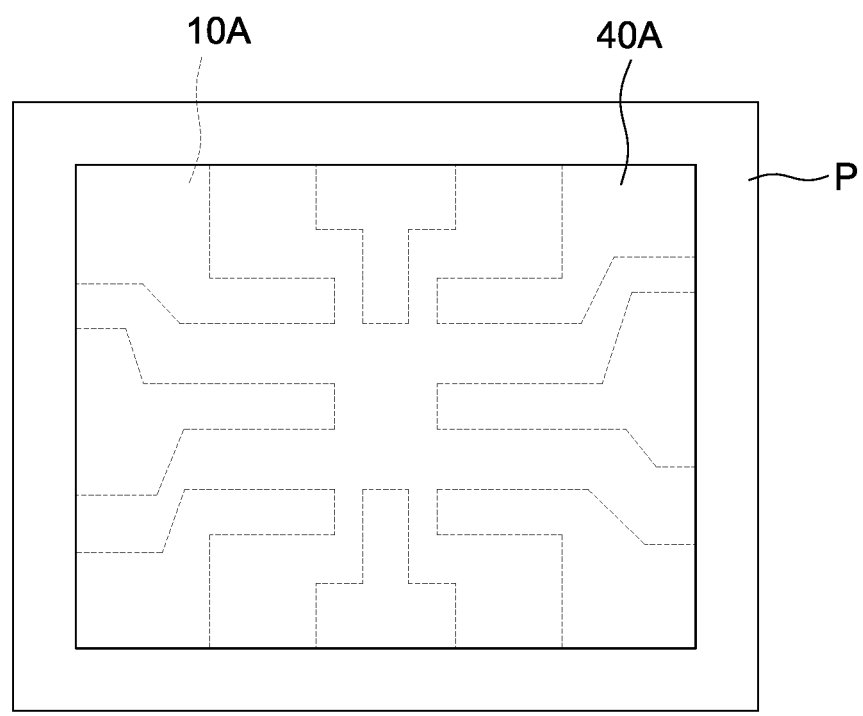
FIG. 2E illustrates a top view of a semiconductor package structure in accordance with some embodiments of the present disclosure.

FIG. 2E illustrates a top view of a semiconductor package structure in accordance with some embodiments of the present disclosure. In some embodiments, the structure in FIG. 2E may illustrate a top view of the semiconductor package structure 2A shown in FIG. 2A. Some elements are omitted in FIG. 2E for clarity.

In some embodiments, the balance structure 40 covers the substrate 10 from a top view perspective. In some embodiments, a projection 40A of the balance structure 40 on a plane P overlaps a protection 10A of the substrate 10 on the plane P. The plane P may refer to a virtual plane serving as a reference. In some embodiments, a ratio of an area of the projection 40A of the balance structure 40 on the plane P to an area of the projection 10A of the substrate 10 on the plane P is from about 0.8 to about 1.2. In some embodiments, the aforesaid ratio may be from about 0.9 to about 1.1.

Figure 3A:
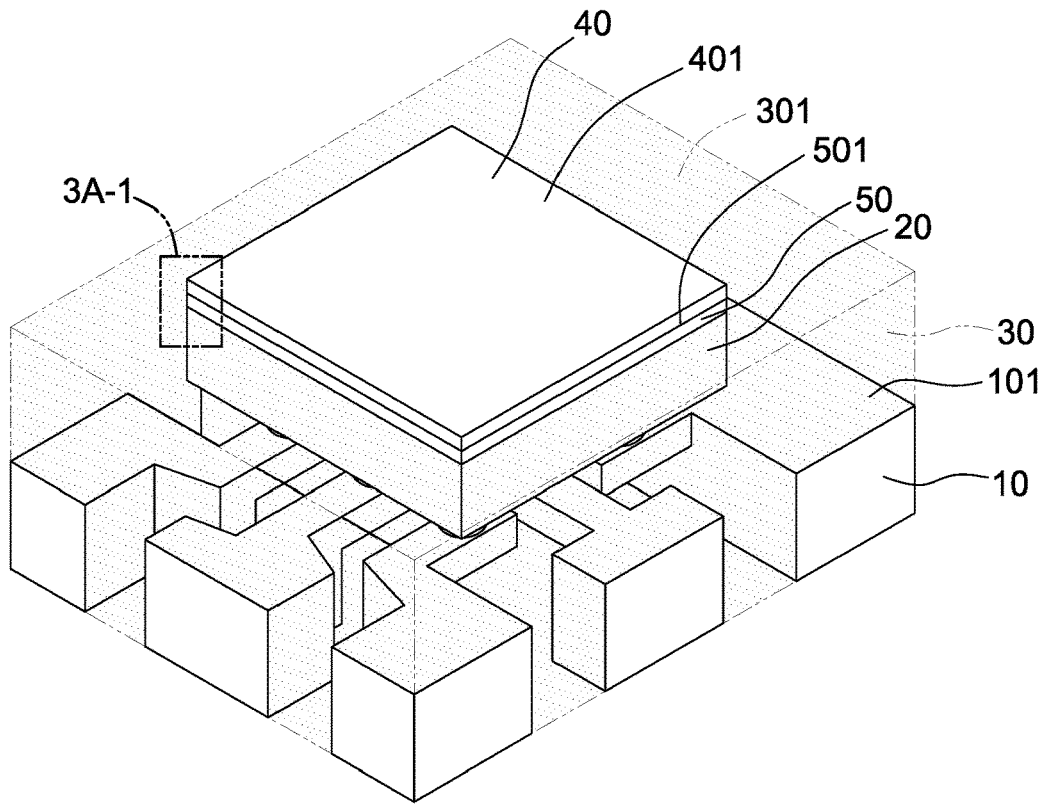
FIG. 3A illustrates a cross-sectional view of a semiconductor package structure in accordance with some embodiments of the present disclosure.

FIG. 3A illustrates a cross-sectional view of a semiconductor package structure 3A in accordance with some embodiments of the present disclosure. The semiconductor package structure 3A is similar to the semiconductor package structure 1A in FIG. 1A except that, for example, the balance structure 40 includes a different structure.

In some embodiments, the balance structure 40 is disposed over the warpage-resistant layer 50. In some embodiments, an upper surface (i.e., the surface 501) is coplanar with an upper surface (i.e., the surface 301') of the encapsulant 30, and the balance structure 40 is disposed on the upper surface (i.e., the surface 501) of the warpage-resistant layer 50. In some embodiments, the balance structure 40 is free from contacting the encapsulant 30. In some embodiments, the upper surface (i.e., the surface 401) and the upper surface (i.e., the surface 301') are at different elevations.

Figures 1, 3A:
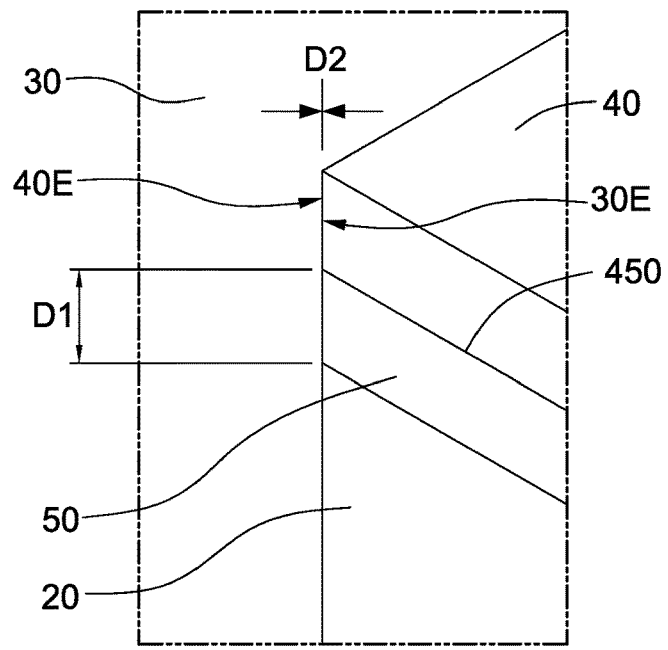

FIG. 3A-1 illustrates a cross-sectional view of a portion 3A-1 of a semiconductor package structure 3A in accordance with some embodiments of the present disclosure.

In some embodiments, the balance structure 40 and the semiconductor device 20 are spaced apart by the distance D1. In some embodiments, the distance D2 between the balance structure 40 and the encapsulant 30 by be defined by an edge 40E of the balance structure 40 and an edge 30E of the encapsulant 30 adjacent to an interface 450 between the balance structure 40 and the warpage-resistant layer 50. In some embodiments, the distance D1 between the balance structure 40 and the semiconductor device 20 is greater than the distance D2 between the balance structure 40 and the encapsulant 30.

Figure 3B:
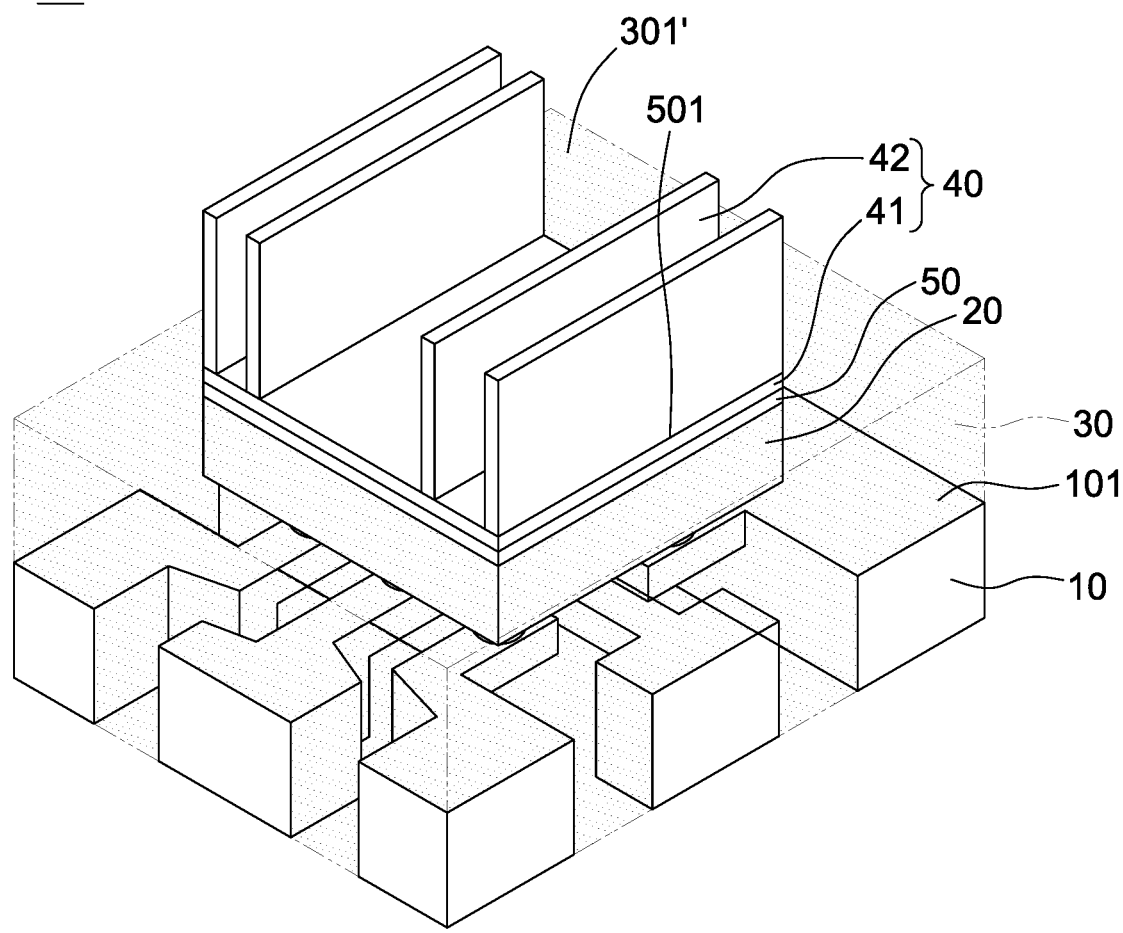
FIG. 3B illustrates a cross-sectional view of a semiconductor package structure in accordance with some embodiments of the present disclosure.

FIG. 3B illustrates a cross-sectional view of a semiconductor package structure 3B in accordance with some embodiments of the present disclosure. The semiconductor package structure 3B is similar to the semiconductor package structure 3A in FIG. 3A except that, for example, the balance structure 40 includes a different structure.

In some embodiments, the balance structure 40 includes a plate 41 and a plurality of fins 42 disposed on the plate. In some embodiments, the surface 501 of the warpage-resistant layer 50 is coplanar with the surface 301' of the encapsulant 30, and the plate 41 is disposed on the surface 501 of the warpage-resistant layer 50.

Figure 4A:
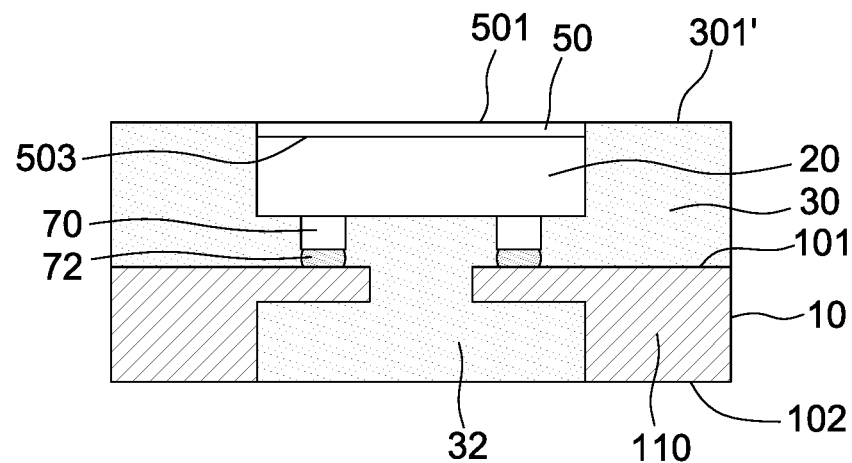
FIG. 4A illustrates a cross-sectional view of a semiconductor package structure in accordance with some embodiments of the present disclosure.

FIG. 4A illustrates a cross-sectional view of a semiconductor package structure 4A in accordance with some embodiments of the present disclosure. The semiconductor package structure 4A is similar to the semiconductor package structure 1A in FIG. 1A except that, for example, the semiconductor package structure 4A does not includes a balance structure (or a heat dissipation structure).

In some embodiments, the surface 501 of the warpage-resistant layer 50 is coplanar with the surface 301' of the encapsulant 30. In some embodiments, the surface 501 of the warpage-resistant layer 50 is exposed from the encapsulant 30, and a surface roughness of the surface 501 of the warpage-resistant layer 50 is greater than a surface roughness of the surface 503 of the warpage-resistant layer 50.

According to some embodiments of the present disclosure, the warpage-resistant layer 50 covering the back surface of the semiconductor device 20 may serve as a protection layer for the semiconductor device 20. For example, the warpage-resistant layer 50 can prevent the back surface of the semiconductor device 20 from being damaged by a grinding operation of the encapsulant 30. Therefore, the semiconductor device 20 can be prevented from being undesirably thinned by the grinding operation, occurrences of cracks or breakages to the semiconductor device 20 can be avoided, and thus the yield of the semiconductor package structure 4A can be improved.

Figure 4B:
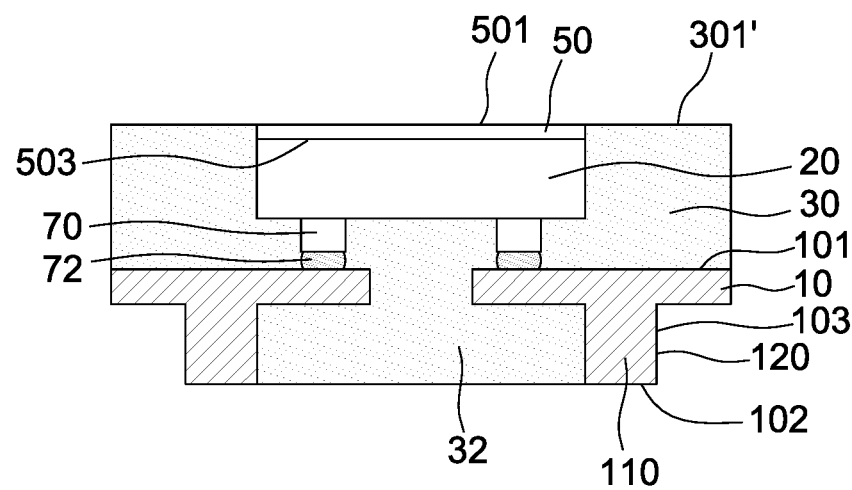
FIG. 4B illustrates a cross-sectional view of a semiconductor package structure in accordance with some embodiments of the present disclosure.

FIG. 4B illustrates a cross-sectional view of a semiconductor package structure 4B in accordance with some embodiments of the present disclosure. The semiconductor package structure 4B is similar to the semiconductor package structure 4A in FIG. 4A except that, for example, the substrate 10 of the semiconductor package structure 4B further includes a wettable flank 120.

In some embodiments, the semiconductor package structure 4B may further include a protection layer (not shown in FIG. 4B) covering the wettable flank 120 of the substrate 10.

Figure 4C:
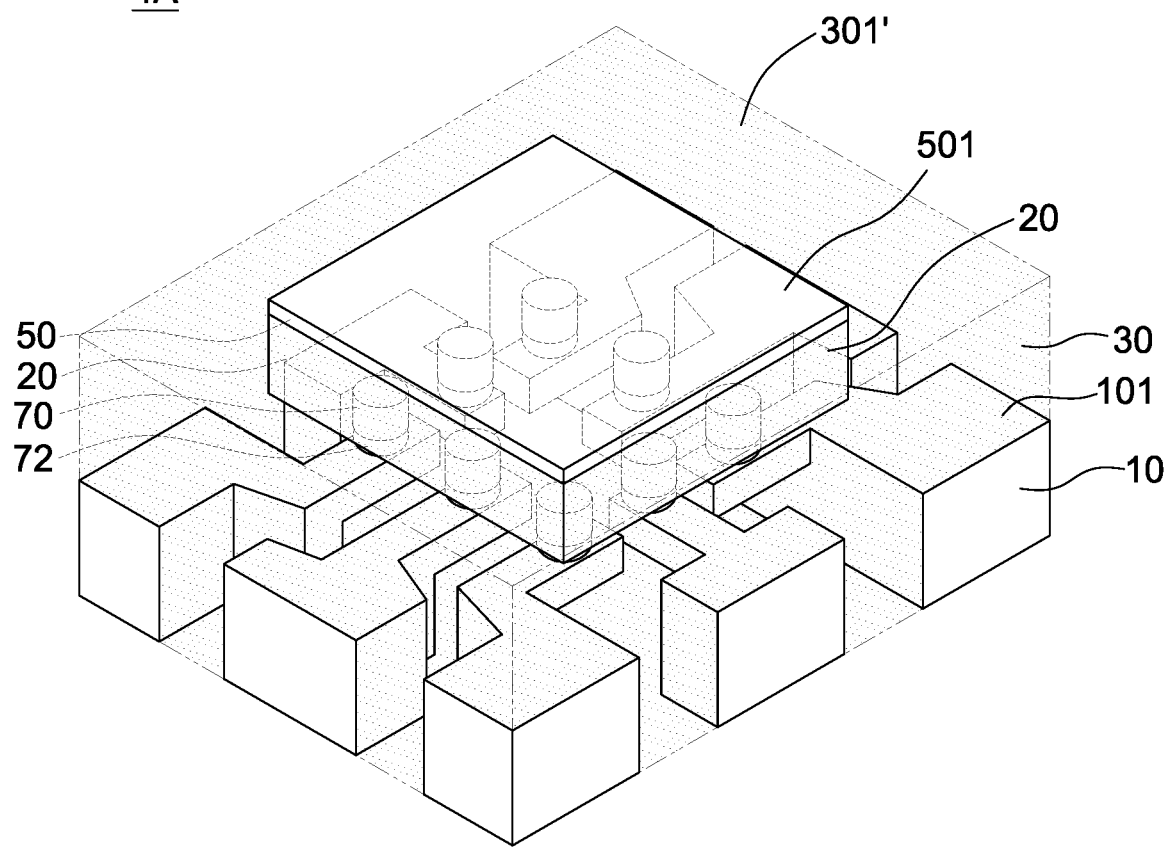
FIG. 4C illustrates a perspective view of a semiconductor package structure in accordance with some embodiments of the present disclosure.

FIG. 4C illustrates a perspective view of a semiconductor package structure in accordance with some embodiments of the present disclosure. In some embodiments, the structure in FIG. 4C may illustrate a perspective view of the semiconductor package structure 4A shown in FIG. 4A.

In some embodiments, the surface 501 of the warpage-resistant layer 50 is coplanar with the surface 301' of the encapsulant 30. In some embodiments, the surface 501 of the warpage-resistant layer 50 is exposed from the encapsulant 30, and a surface roughness of the surface 501 of the warpage-resistant layer 50 is greater than a surface roughness of the surface 503 of the warpage-resistant layer 50.

FIG. 5A, FIG. 5B, FIG. 5C, FIG. 5D, FIG. 5E, and FIG. 5F illustrate various operations in a method of manufacturing a semiconductor package structure in accordance with some embodiments of the present disclosure.

Figure 5A:
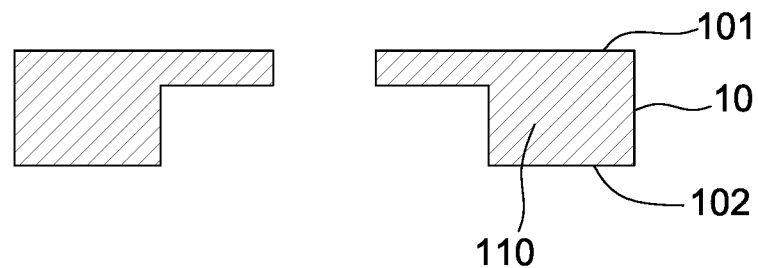
FIG. 5A, FIG. 5B, FIG. 5C, FIG. 5D, FIG. 5E, and FIG. 5F illustrate various operations in a method of manufacturing a semiconductor package structure in accordance with some embodiments of the present disclosure.

Referring to FIG. 5A, a substrate 10 is provided. In some embodiments, the substrate 10 is a leadframe including a plurality of leads 110.

Figure 5B:
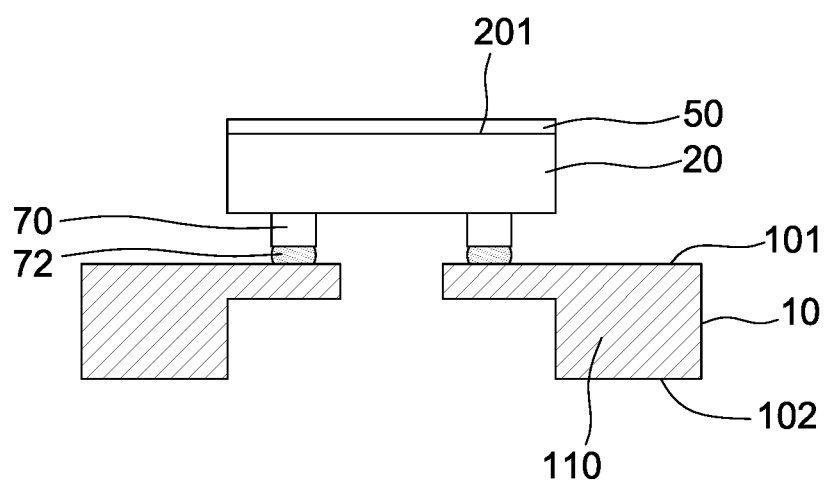

Referring to FIG. 5B, a semiconductor device 20 is disposed on the substrate 10. In some embodiments, a plurality of semiconductor devices 20 may be disposed on the substrate 10. In some embodiments, a warpage-resistant layer 50 may be formed on a surface 201 (or a back surface) of the semiconductor device 20 prior to disposing the semiconductor device 20 on the substrate 10. The warpage-resistant layer 50 may be formed by sputtering, plating, deposition, or a combination thereof. In some embodiments, the warpage-resistant layer 50 may include titanium/copper. In some embodiments, the semiconductor device 20 is connected to the substrate 10 through conductive elements 70 (or conductive pillars) and conductive bumps 72.

Figure 5C:
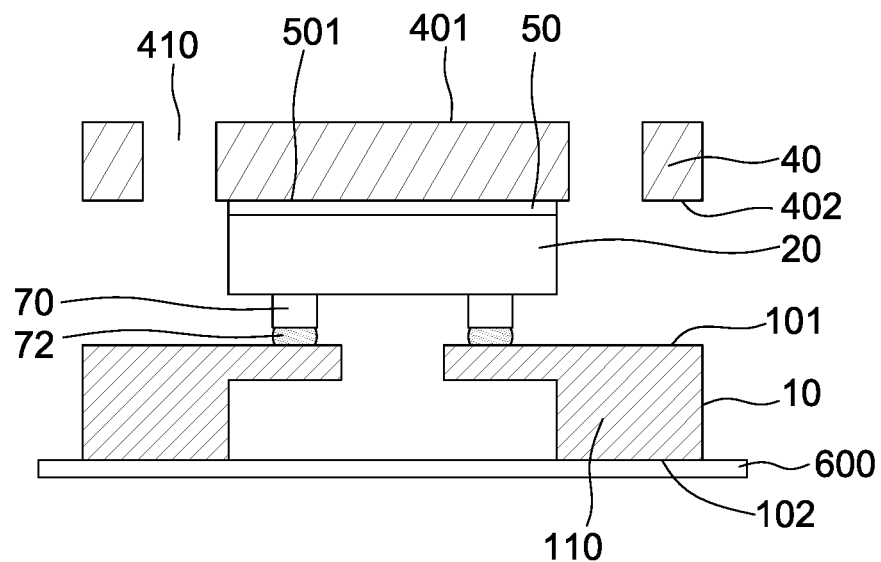

Referring to FIG. 5C, a balance structure 40 is disposed on the semiconductor device 20. In some embodiments, the balance structure 40 may be disposed on a plurality of the semiconductor devices 20. In some embodiments, the balance structure 40 is disposed on the warpage-resistant layer 50 on the semiconductor device 20. In some embodiments, the balance structure 40 has one or more openings 410 (or through holes). In some embodiments, the substrate 10 is disposed on a carrier 600. In some embodiments, the balance structure 40 is a pre-formed structure. In some embodiments, the balance structure 40 is a heat dissipation structure, such as a heat sink.

Figure 5D:
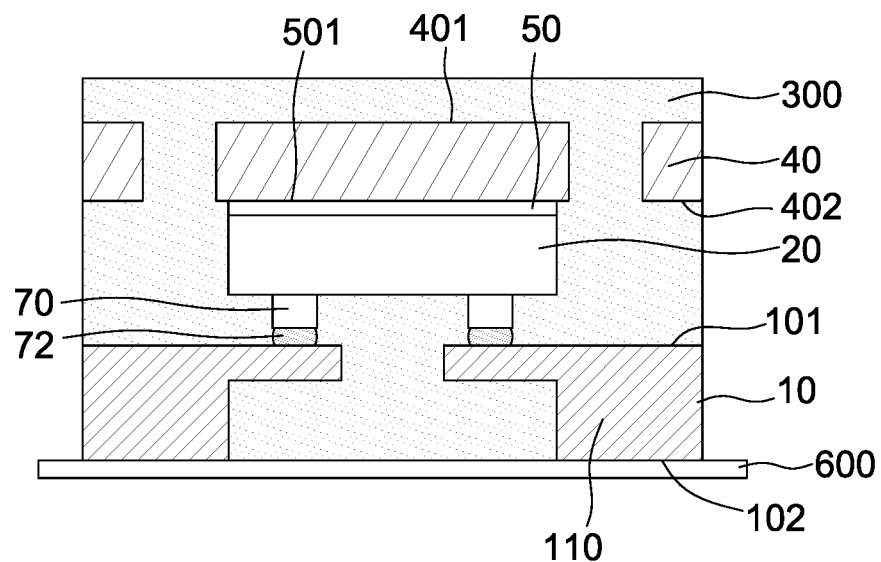

Referring to FIG. 5D, the semiconductor device 20 is encapsulated by an encapsulant 300. In some embodiments, a plurality of the semiconductor devices 20 may be encapsulated by the encapsulant 300. In some embodiments, the semiconductor device 20 is encapsulated after the balance structure 40 is disposed on the semiconductor device 20. In some embodiments, the semiconductor device 20 is encapsulated by providing the encapsulant 300 through the openings 410 (or through holes) of the balance structure 40. The carrier 600 may be configured as a stop layer for the encapsulant 300. In some embodiments, the encapsulant 300 is applied to cover the semiconductor device 20 and the balance structure 40. In some embodiments, the substrate 10 is disposed on a carrier 600 prior to encapsulating the semiconductor device 20.

Figure 5E:
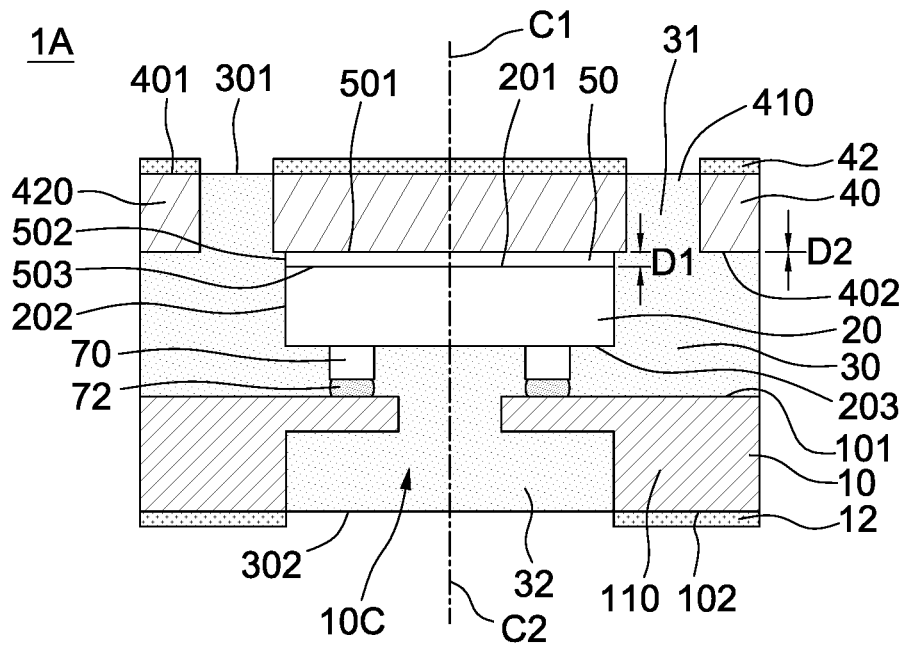

Referring to FIG. 5E, a grinding operation may be performed on the encapsulant 300 to form an encapsulant 30 that exposes a surface 401 of the balance structure 40, and protection layers 12 and 42 are formed on the bottom surface (i.e., the surface 102) of the substrate 10 and the surface 401 of the balance structure 40. In some embodiments, a plurality of the semiconductor devices 20 may be encapsulated by the encapsulant 30, and a singulation operation may be performed on the encapsulant 30 to form a plurality of singulated semiconductor package structures. As such, the semiconductor package structure 1A illustrated in FIG. 1A is formed.

Figure 5F:
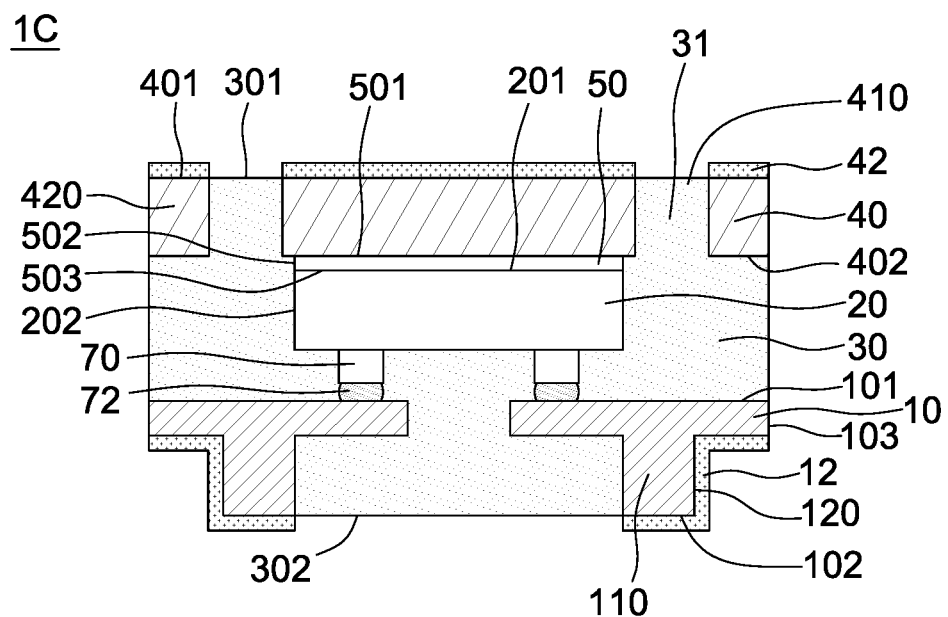

Next, referring to FIG. 5F, a portion of the substrate 10 is removed to form a wettable flank 120. In some embodiments, the wettable flank 120 may be formed by cutting, etching, or a combination thereof. As such, the semiconductor package structure 1C illustrated in FIG. 1C is formed.

According to some embodiments of the present disclosure, the balance structure 40 is disposed onto the semiconductor device 20 prior to encapsulating the semiconductor device 20, and thus an intermediate structure of an encapsulated semiconductor device 20 is not formed prior to connecting the balance structure 40 to the semiconductor device 20. Thus, warpage which could have been occurred on the encapsulated semiconductor device 20 can be prevented, and failing to connecting the balance structure 40 to the encapsulated semiconductor device(s) 20 having warpage can be prevented as well. Therefore, the encapsulant 30 can be filled in the spaces between the balance structure 40 and the substrate 10 so as to form a "moldlock" structure which strengthen the entire structure of the as-formed semiconductor package structure, and warpage which could have occurred during the manufacturing process of the semiconductor package structure can be effectively prevented, which is advantageous to increasing the yield.

In addition, in the cases where a plurality of semiconductor devices are encapsulated by an encapsulant, the as-formed intermediate structure including an encapsulant encapsulating a plurality of semiconductor devices is relatively vulnerable to warpage due to the relatively low rigidity of the encapsulant which may be unable to provide sufficient structural strength for the encapsulated semiconductor devices. In contrast, according to some embodiments of the present disclosure, the balance structure 40 is disposed on or connected to the semiconductor device(s) 20 prior to encapsulating the semiconductor device(s) 20 by the encapsulant 30, the aforesaid issue caused by the relatively low rigidity of the encapsulant 30 can be prevented, the balance structure 40 can provide sufficient structural strength for the semiconductor device(s) 20, and thus the strength the entire structure of the as-formed semiconductor package structure can be improved.

Figure 6A:
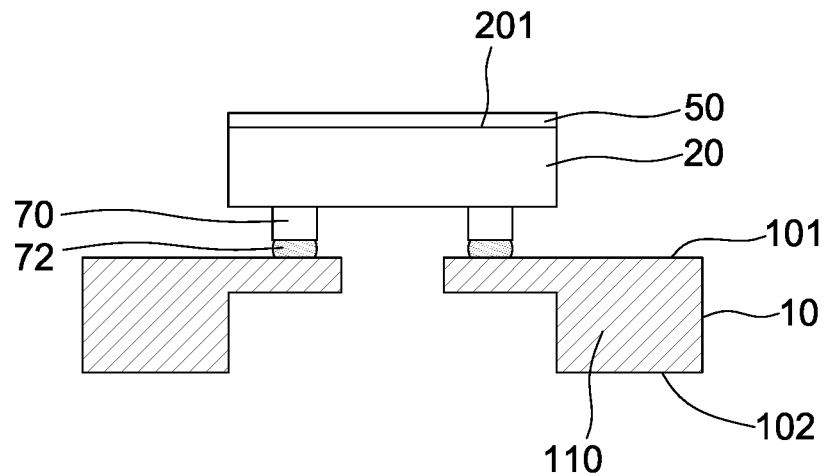
FIG. 6A, FIG. 6B, FIG. 6C, FIG. 6D, and FIG. 6E illustrate various operations in a method of manufacturing a semiconductor package structure in accordance with some embodiments of the present disclosure.

FIG. 6A, FIG. 6B, FIG. 6C, FIG. 6D, and FIG. 6E illustrate various operations in a method of manufacturing a semiconductor package structure in accordance with some embodiments of the present disclosure;

Referring to FIG. 6A, operations similar to those illustrated in FIGS. 5A-5B are performed to form a warpage-resistant layer 50 on a surface 201 of a semiconductor device 20 and dispose the semiconductor device 20 on a substrate 10.

Figure 6B:
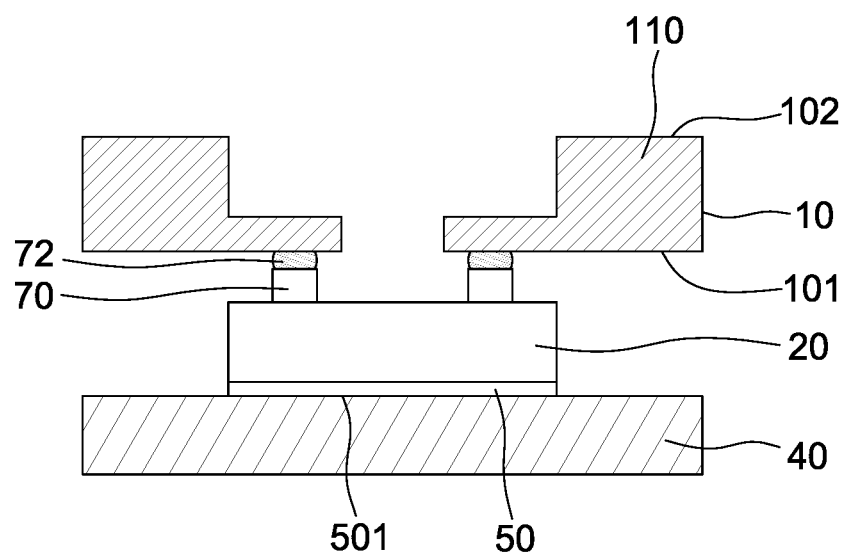

Referring to FIG. 6B, a balance structure 40 that is free of an opening or a through hole is disposed on the semiconductor device 20. In some embodiments, the balance structure 40 is disposed on the warpage-resistant layer 50 on the semiconductor device 20. Then, the as-formed structure is flipped over by 180°.

Figure 6C:
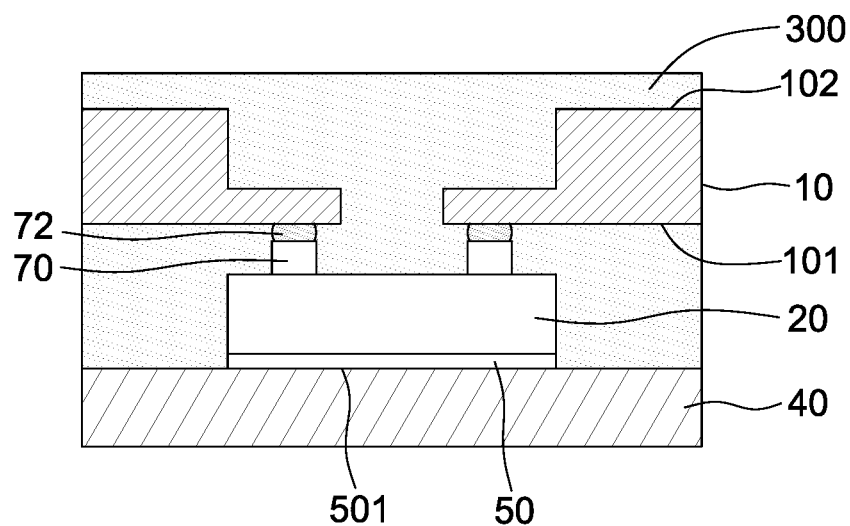

Referring to FIG. 6C, the semiconductor device 20 is encapsulated by providing an encapsulant 300 from the substrate 10 towards the semiconductor device 20, and the balance structure 40 is configured as a stop layer for the encapsulant 300. In some embodiments, the encapsulant 300 is applied to cover the substrate 10 and the semiconductor device 20.

Figure 6D:
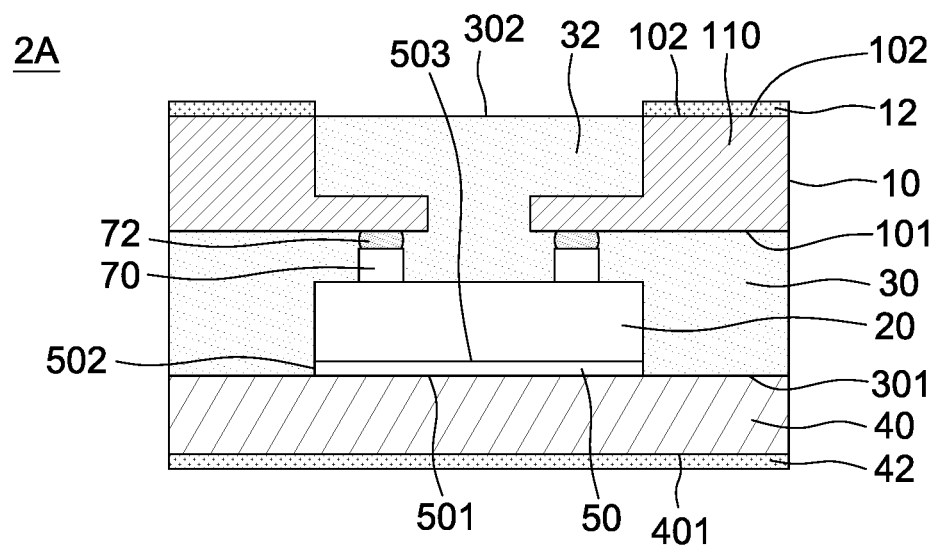

Referring to FIG. 6D, a grinding operation may be performed on the encapsulant 300 to form an encapsulant 30 that exposes a surface 102 of the substrate 10, and protection layers 12 and 42 are formed on the surface 102 of the substrate 10 and the surface 401 of the balance structure 40. As such, the semiconductor package structure 2A illustrated in FIG. 2A is formed.

In some other embodiments, after the grinding operation is performed, an etching operation may be further performed on the exposed surface 102 of the substrate 10 so as to remove roughness microstructures formed from the grinding operation. As such, the surface 102 may be recessed from the surface 302 of the encapsulant 30 after the etching operation. After the protection layer 12 is formed on the recessed surface 102 of the substrate 10, the semiconductor package structure 2B illustrated in FIG. 2B may be formed.

Figure 6E:
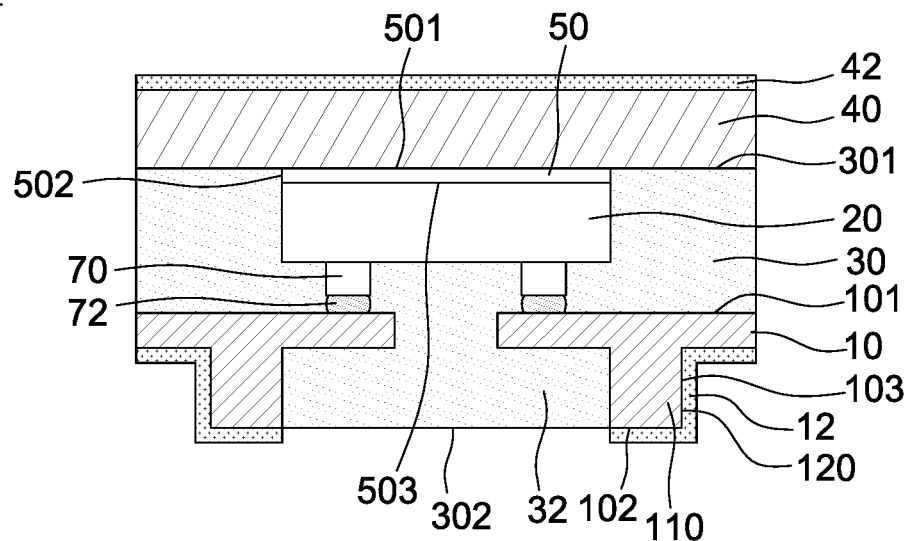

Next, referring to FIG. 6E, a portion of the substrate 10 is removed to form a wettable flank 120. In some embodiments, the wettable flank 120 may be formed by cutting, etching, or a combination thereof. As such, the semiconductor package structure 2C illustrated in FIG. 2C is formed.

Figure 7A:
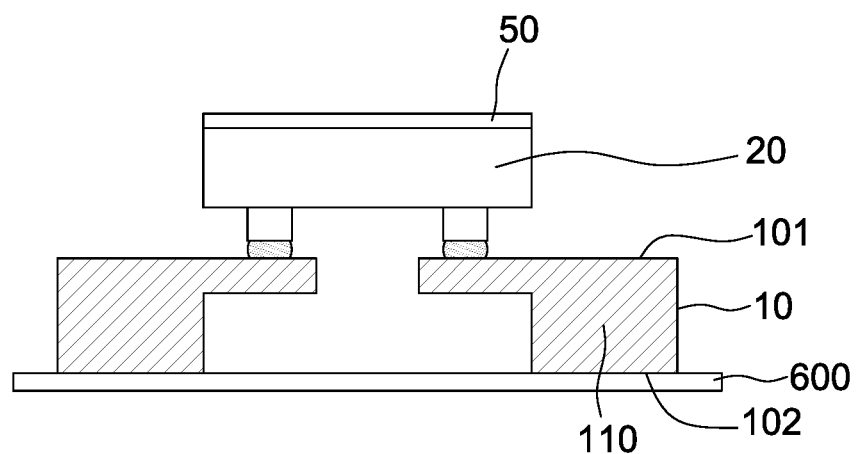
FIG. 7A, FIG. 7B, and FIG. 7C illustrate various operations in a method of manufacturing a semiconductor package structure in accordance with some embodiments of the present disclosure.
Figure 7B:
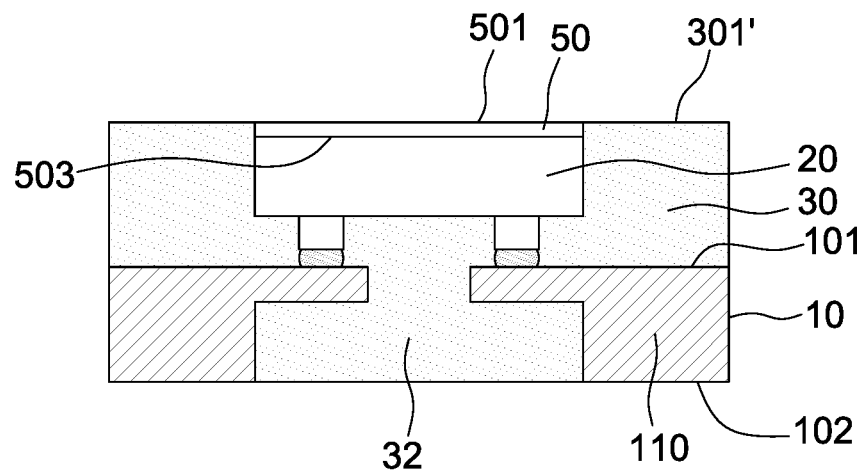
Figure 7C:
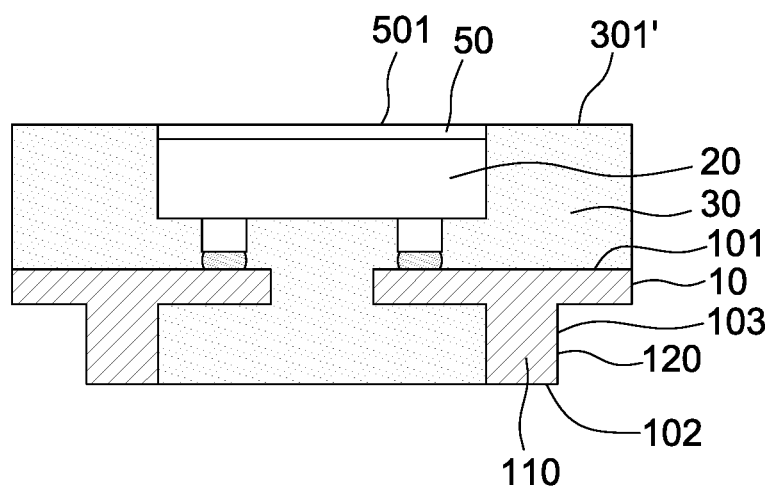

FIG. 7A, FIG. 7B, and FIG. 7C illustrate various operations in a method of manufacturing a semiconductor package structure in accordance with some embodiments of the present disclosure.

Referring to FIG. 7A, operations similar to those illustrated in FIGS. 5A-5B are performed to form a warpage-resistant layer 50 on a surface 201 of a semiconductor device 20 and dispose the semiconductor device 20 on a substrate 10.

Referring to FIG. 7B, the semiconductor device 20 is encapsulated by an encapsulant 30. In some embodiments, the substrate 10 may be disposed on a carrier configured as a stop layer for the encapsulant 30, and the encapsulant 30 may be applied to cover the warpage-resistant layer 50, the semiconductor device 20, and portions of the substrate 10. Next, a grinding operation may be performed on the encapsulant 30 to expose a surface 501 of the warpage-resistant layer 50. As such, the semiconductor package structure 4A illustrated in FIG. 4A is formed. In some other embodiments, a plurality of semiconductor devices 20 may be encapsulated by an encapsulant 30 followed by forming warpage-resistant layers 50 on surfaces of the semiconductor devices 20 exposed from the encapsulant 30. The encapsulant 30 is then singulated to form a plurality of semiconductor package structures. In the present embodiments, the surface 501 of the warpage-resistant layer 50 may be protruded out of the surface 301' of the encapsulant 30.

Next, referring to FIG. 7C, a portion of the substrate 10 is removed to form a wettable flank 120. In some embodiments, the wettable flank 120 may be formed by cutting, etching, or a combination thereof. As such, the semiconductor package structure 4B illustrated in FIG. 4B is formed.

FIG. 8A, FIG. 8B, FIG. 8C, FIG. 8D, and FIG. 8E illustrate various operations in a method of manufacturing a semiconductor package structure in accordance with some embodiments of the present disclosure.

Figure 8A:
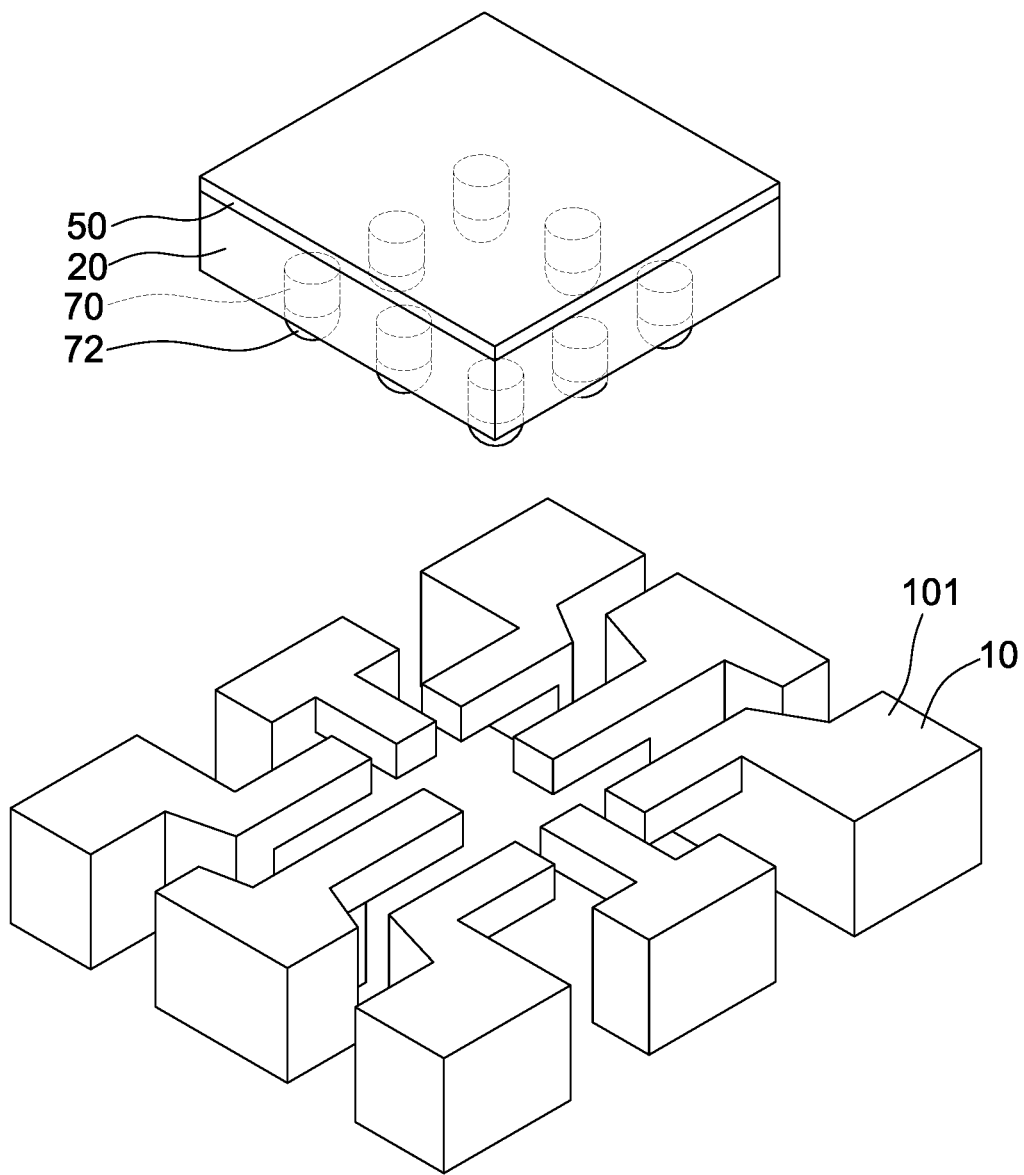
FIG. 8A, FIG. 8B, FIG. 8C, FIG. 8D, and FIG. 8E illustrate various operations in a method of manufacturing a semiconductor package structure in accordance with some embodiments of the present disclosure.

Referring to FIG. 8A, a substrate 10 is provided, and a warpage-resistant layer 50 is formed on a back surface of a semiconductor device 20.

Figure 8B:
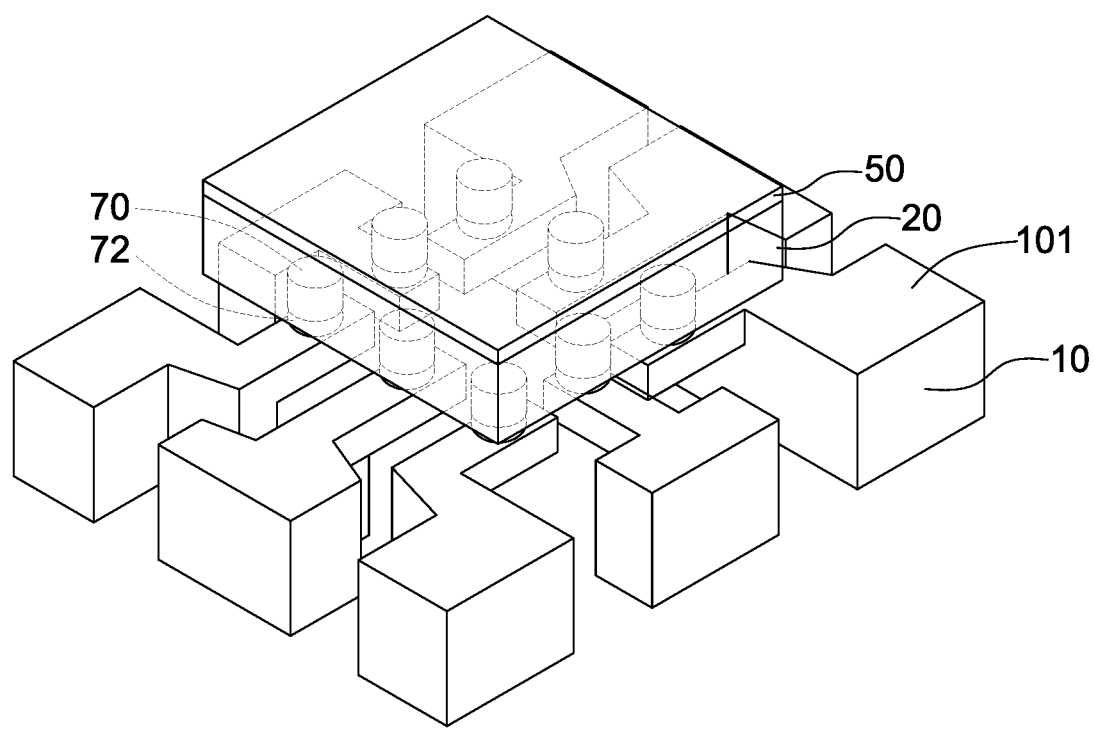

Referring to FIG. 8B, the semiconductor device 20 is disposed on the substrate 10. In some embodiments, the semiconductor device 20 is connected to the substrate 10 through conductive elements 70 (or conductive pillars) and conductive bumps 72.

Figure 8C:
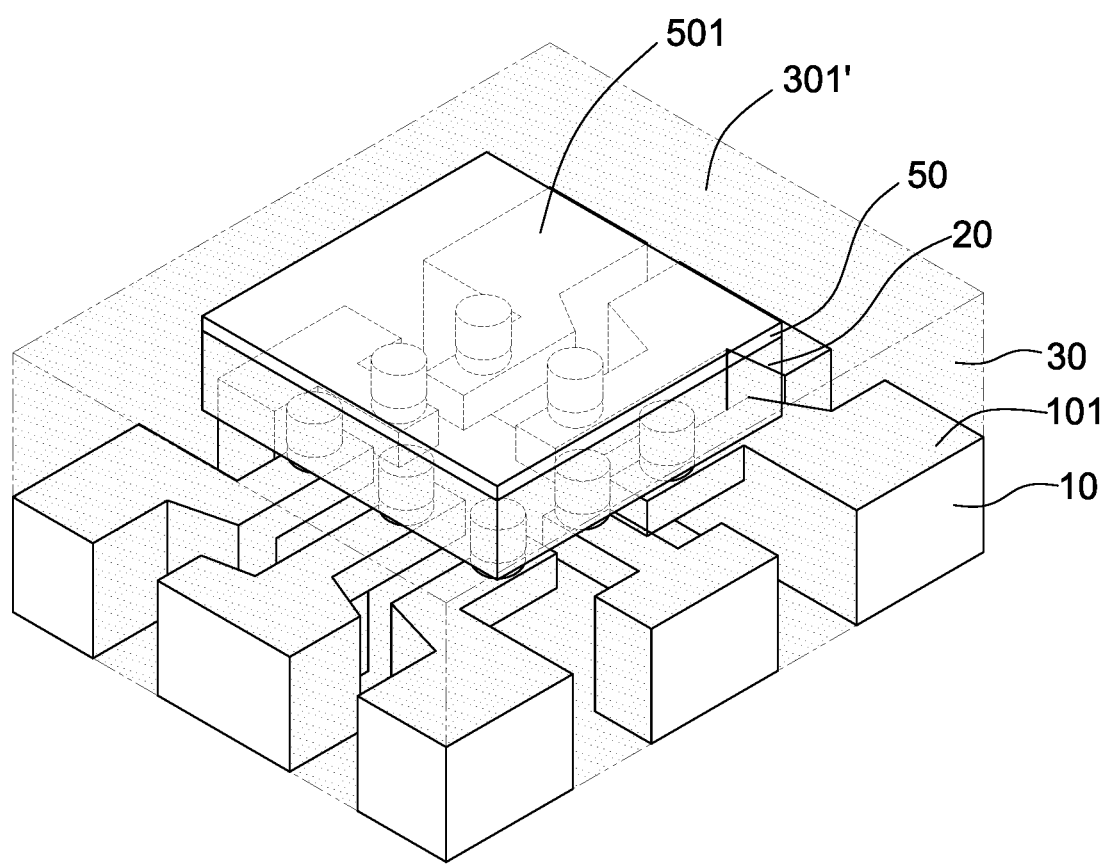

Referring to FIG. 8C, the semiconductor device 20 is encapsulated by an encapsulant 30. In some embodiments, the substrate 10 may be disposed on a carrier configured as a stop layer for the encapsulant 30, and the encapsulant 30 may be applied to cover the warpage-resistant layer 50, the semiconductor device 20, and portions of the substrate 10. Next, a grinding operation may be performed on the encapsulant 30 to expose a surface 501 of the warpage-resistant layer 50.

Figure 8D:
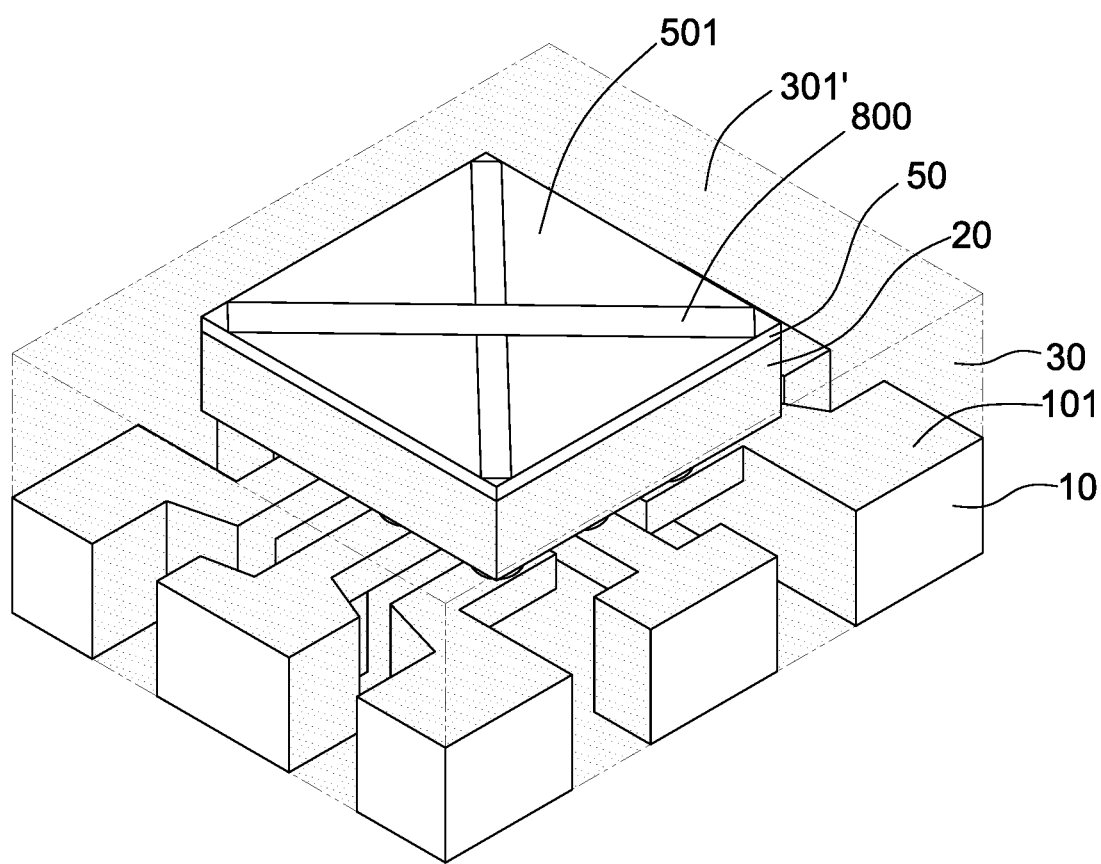

Referring to FIG. 8D, an adhesive layer 800 may be disposed or attached to the surface 501 of the warpage-resistant layer 50. In some embodiments, the adhesive layer 800 includes a tape.

Figure 8E:
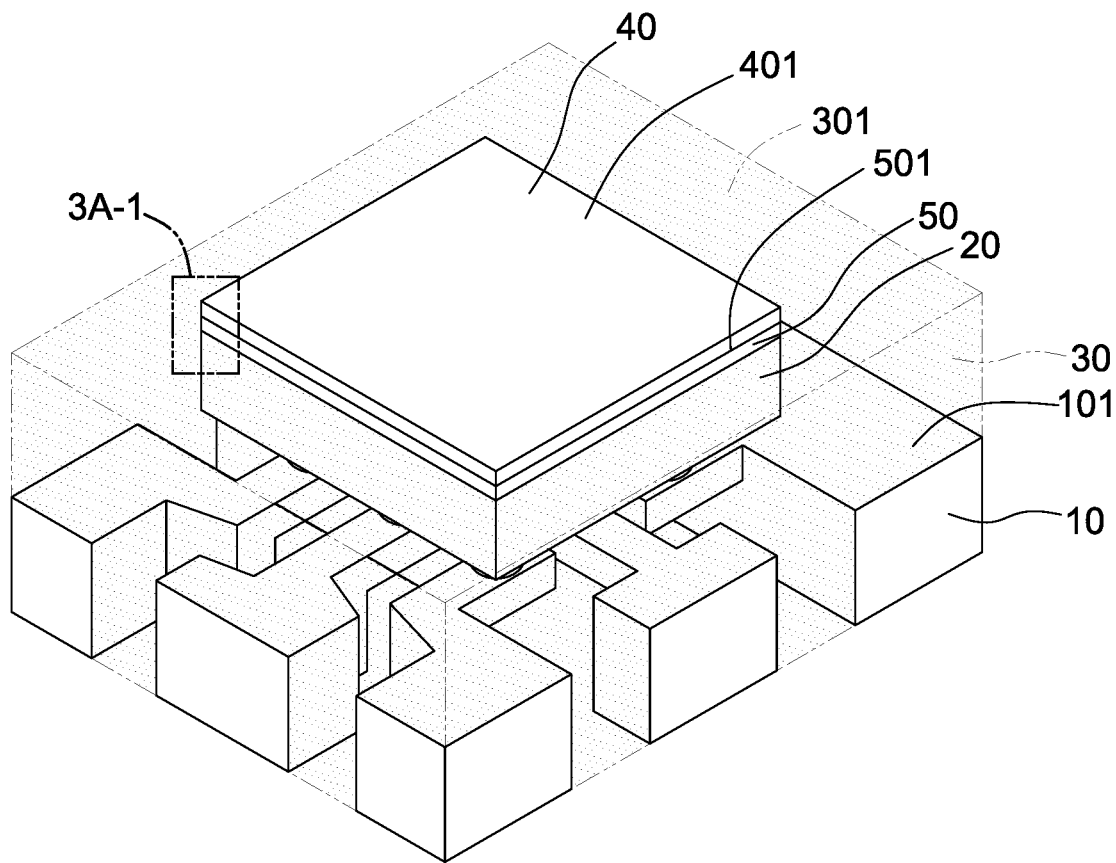

Referring to FIG. 8E, a balance structure 40 is attached to the surface 501 of the warpage-resistant layer 50 through the adhesive layer 800. As such, the semiconductor package structure 3A illustrated in FIG. 3A is formed.

Figure 9A:
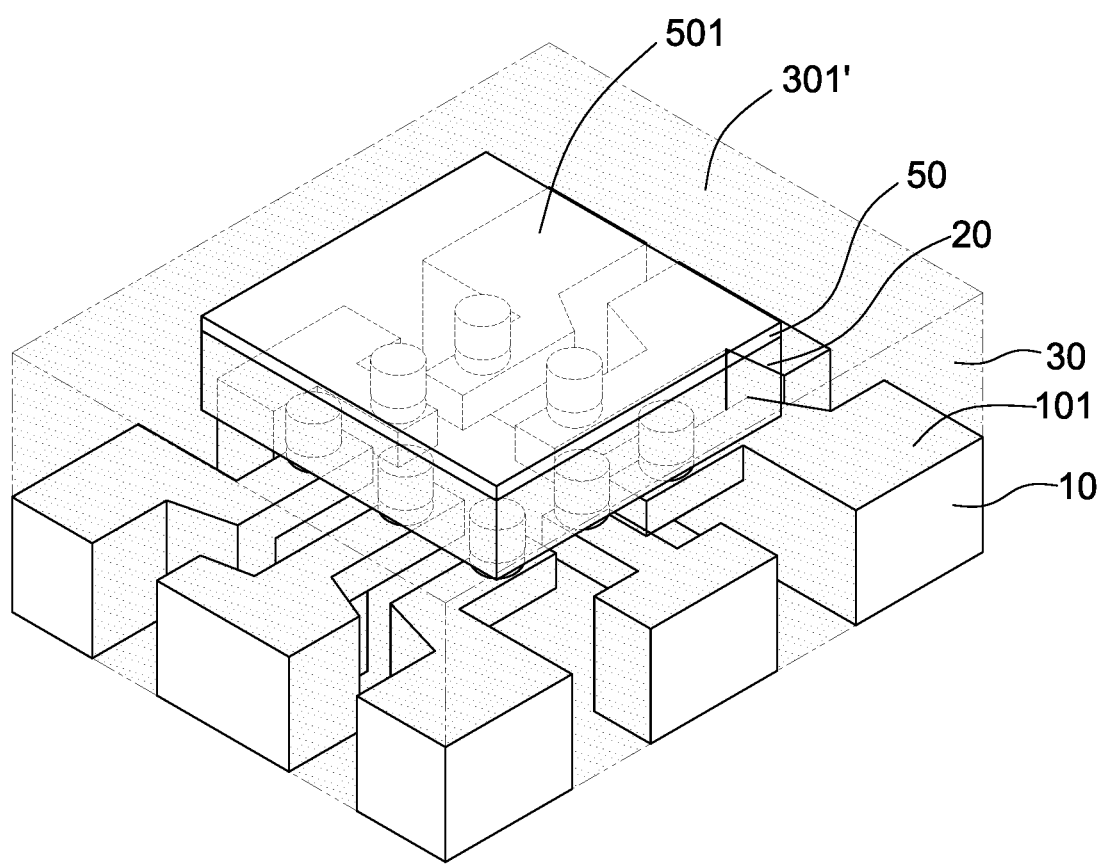
FIG. 9A and FIG. 9B illustrate various operations in a method of manufacturing a semiconductor package structure in accordance with some embodiments of the present disclosure.
Figure 9B:
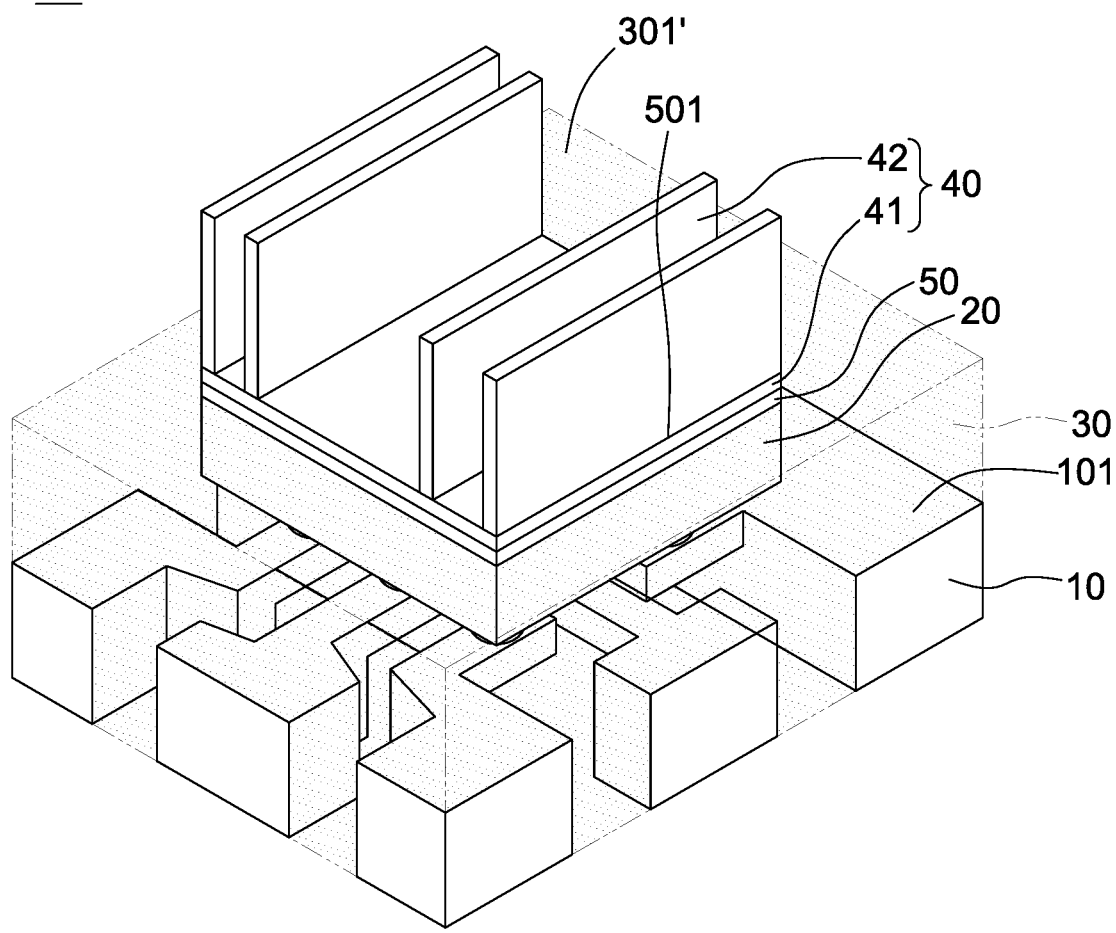

FIG. 9A and FIG. 9B illustrate various operations in a method of manufacturing a semiconductor package structure in accordance with some embodiments of the present disclosure.

Referring to FIG. 9A, operations similar to those illustrated in FIGS. 8A-8C are performed to form a warpage-resistant layer 50 on a back surface of a semiconductor device 20, dispose the semiconductor device 20 on a substrate 10, and encapsulate the semiconductor device 20 by an encapsulant 30. A grinding operation may be performed on the encapsulant 30 to expose the surface 501 of the warpage-resistant layer 50.

Referring to FIG. 9B, a balance structure 40 is disposed on the surface 501 of the warpage-resistant layer 50. In some embodiments, the balance structure 40 may be a pre-formed structure. In some embodiments, the balance structure 40 may be attached to the surface 501 of the warpage-resistant layer 50 through the adhesive layer (not shown in FIG. 9B). As such, the semiconductor package structure 3B illustrated in FIG. 3B is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±10, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
a substrate;
a semiconductor device disposed over the substrate;
an encapsulant encapsulating the semiconductor device;
a balance structure over the semiconductor device and contacting the encapsulant; and
a warpage-resistant layer between the semiconductor device and the balance structure, wherein the warpage-resistance layer comprises a metal layer,
wherein the balance structure comprises a metal material directly contacting the warpage-resistant layer; and
wherein the warpage-resistant layer comprises a microstructure on a surface contacting the balance structure.

2. The semiconductor package structure as claimed in claim 1, wherein the warpage-resistant layer comprises titanium/copper.

3. The semiconductor package structure as claimed in claim 1, wherein the balance structure is entirely above the warpage-resistant layer.

4. The semiconductor package structure as claimed in claim 3, wherein a lateral surface of the balance structure substantially aligns to a lateral surface of the warpage-resistance layer and a lateral surface of the semiconductor device.

5. The semiconductor package structure as claimed in claim 1, wherein a bottommost surface of the balance structure directly contacts a topmost surface of the warpage-resistant layer.

6. The semiconductor package structure as claimed in claim 1, wherein the balance structure is entirely above the warpage-resistant layer, and a bottommost surface of the balance structure directly contacts a topmost surface of the warpage-resistant layer.

7. The semiconductor package structure as claimed in claim 1, wherein a peripheral outline of the balance structure overlaps a peripheral outline of the substrate from a top view perspective.

8. A semiconductor package structure, comprising:
a substrate;
a semiconductor device disposed over the substrate;
an encapsulant encapsulating the semiconductor device;
a balance structure over the semiconductor device and contacting the encapsulant; and
a warpage-resistant layer between the semiconductor device and the balance structure, wherein the warpage-resistance layer comprises a metal layer,
wherein a surface roughness of an upper surface of the balance structure is greater than a surface roughness of a bottom surface of the balance structure.

9. A semiconductor package structure, comprising:
a substrate;
a semiconductor device disposed over the substrate;
an encapsulant encapsulating the semiconductor device;
a balance structure over the semiconductor device and contacting the encapsulant; and
a warpage-resistant layer between the semiconductor device and the balance structure, wherein the warpage-resistance layer comprises a metal layer,
wherein a surface roughness of an upper surface of the warpage-resistant layer is greater than a surface roughness of a bottom surface of the warpage-resistant layer.

* * * * *